United States Patent
Nitta et al.

(10) Patent No.: US 11,591,717 B2
(45) Date of Patent: Feb. 28, 2023

(54) VAPOR PHASE EPITAXIAL GROWTH DEVICE

(71) Applicants: National University Corporation Nagoya University, Nagoya (JP); TOYODA GOSEI CO., LTD, Kiyosu (JP)

(72) Inventors: Shugo Nitta, Nagoya (JP); Yoshio Honda, Nagoya (JP); Kentaro Nagamatsu, Nagoya (JP); Hiroshi Amano, Nagoya (JP); Naoki Fujimoto, Nagoya (JP)

(73) Assignees: NATIONAL UNIVERSITY CORPORATION NAGOYA UNIVERSITY, Nagoya (JP); TOYODA GOSEI CO., LTD., Kiyosu (JP)

( * ) Notice: Subject to any disclaimer, the term of this patent is extended or adjusted under 35 U.S.C. 154(b) by 185 days.

(21) Appl. No.: 16/649,371

(22) PCT Filed: Sep. 7, 2018

(86) PCT No.: PCT/JP2018/033324
§ 371 (c)(1),
(2) Date: Mar. 20, 2020

(87) PCT Pub. No.: WO2019/059009
PCT Pub. Date: Mar. 28, 2019

(65) Prior Publication Data
US 2020/0270767 A1    Aug. 27, 2020

(30) Foreign Application Priority Data

Sep. 25, 2017  (JP) .............................. JP2017-183987
May 11, 2018   (JP) .............................. JP2018-092435
May 11, 2018   (JP) .............................. JP2018-092438

(51) Int. Cl.
*C30B 35/00* (2006.01)
*C30B 29/16* (2006.01)
(Continued)

(52) U.S. Cl.
CPC ............ *C30B 35/007* (2013.01); *C30B 29/16* (2013.01); *C30B 29/36* (2013.01); *C30B 29/38* (2013.01); *H01L 21/205* (2013.01); *Y10T 117/00* (2015.01)

(58) Field of Classification Search
CPC ... C23C 16/4412; C23C 16/455; C30B 25/14; C30B 29/16; C30B 29/36; C30B 29/38;
(Continued)

(56) References Cited

U.S. PATENT DOCUMENTS 5,304,248 A  *  4/1994  Cheng ..................... C23C 16/04
                                                    118/728
5,595,606 A  *  1/1997  Fujikawa .......... C23C 16/45572
                                                    118/724

(Continued)

FOREIGN PATENT DOCUMENTS

CN     102108547 A     6/2011
CN     103320763 A     9/2013
(Continued)

OTHER PUBLICATIONS

Office Action with English translation dated May 8, 2021 for corresponding Chinese Application No. 2018800619094.
(Continued)

*Primary Examiner* — Hua Qi
(74) *Attorney, Agent, or Firm* — Miles & Stockbridge P.C.

(57) ABSTRACT

A vapor phase epitaxial growth device comprises a reactor vessel and a wafer holder arranged within the reactor vessel. The wafer holder includes a wafer holding surface config-
(Continued)

ured to hold a wafer with a wafer surface oriented substantially vertically downward. The device comprises a first material gas supply pipe configured to supply a first material gas and arranged below the wafer holding surface. The device comprises a second material gas supply pipe configured to supply a second material gas and arranged below the wafer holding surface. The device comprises a gas exhaust pipe configured to exhaust gases and arranged below the wafer holding surface. A distance between the gas exhaust pipe and an axis line passing through a center of the wafer holding surface is greater than distances between the axis line and each of the first material gas supply pipe and the second material gas supply pipe.

14 Claims, 16 Drawing Sheets

(51) Int. Cl.
*C30B 29/36* (2006.01)
*C30B 29/38* (2006.01)
*H01L 21/205* (2006.01)

(58) Field of Classification Search
CPC . C30B 29/406; C30B 35/007; H01L 21/0254; H01L 21/0262; H01L 21/205; H01L 21/31
See application file for complete search history.

(56) References Cited

U.S. PATENT DOCUMENTS

| | | | | |
|---|---|---|---|---|
| 6,080,446 A * | 6/2000 | Tobe | .................. | C23C 16/34 427/314 |
| 2008/0083970 A1 * | 4/2008 | Kamber | ................. | C30B 29/403 257/E29.089 |
| 2008/0132040 A1 * | 6/2008 | Wang | ....................... | C30B 25/14 438/478 |
| 2008/0213543 A1 * | 9/2008 | Leibiger | ................. | C30B 25/02 117/85 |
| 2010/0001376 A1 * | 1/2010 | Takamizawa | .......... | C30B 29/403 257/E29.089 |
| 2012/0034149 A1 | 2/2012 | Fujiwara et al. | | |
| 2013/0043442 A1 | 2/2013 | Konno et al. | | |
| 2013/0069075 A1 | 3/2013 | Fujikura et al. | | |
| 2013/0087093 A1 * | 4/2013 | Olgado | ................. | C30B 29/406 117/103 |
| 2013/0247817 A1 | 9/2013 | Konno et al. | | |
| 2013/0292737 A1 | 11/2013 | Fujiwara et al. | | |
| 2014/0196660 A1 | 7/2014 | Fujikura et al. | | |
| 2015/0176122 A1 * | 6/2015 | Hsueh | ................... | C23C 16/308 428/141 |
| 2015/0357416 A1 | 12/2015 | Konno et al. | | |

FOREIGN PATENT DOCUMENTS

| | | | |
|---|---|---|---|
| CN | 106409664 A | 2/2017 | |
| JP | 2002316892 A | 10/2002 | |
| JP | 2003306398 A | 10/2003 | |
| JP | 2006013326 A | 1/2006 | |
| JP | 2008504443 A | 2/2008 | |
| JP | 2010222232 A | 10/2010 | |
| JP | 2011256082 A | 12/2011 | |
| JP | 2013058741 A | 3/2013 | |
| JP | 2013070016 A | 4/2013 | |
| JP | 2013075815 A | 4/2013 | |
| JP | 2014201496 A | 10/2014 | |

OTHER PUBLICATIONS

English Translation of the Written Opinion of the International Searching Authority dated Dec. 11, 2018 in International Application No. PCT/JP2018/033324.
International Search Report dated Dec. 11, 2018 in International Application No. PCT/JP2018/033324.
Office Action with English translation dated Sep. 28, 2021 for corresponding Japanese Application No. JP 2017-183987.
Office Action with English translation dated Sep. 28, 2021 for corresponding Japanese Application No. JP 2018-092435.

* cited by examiner

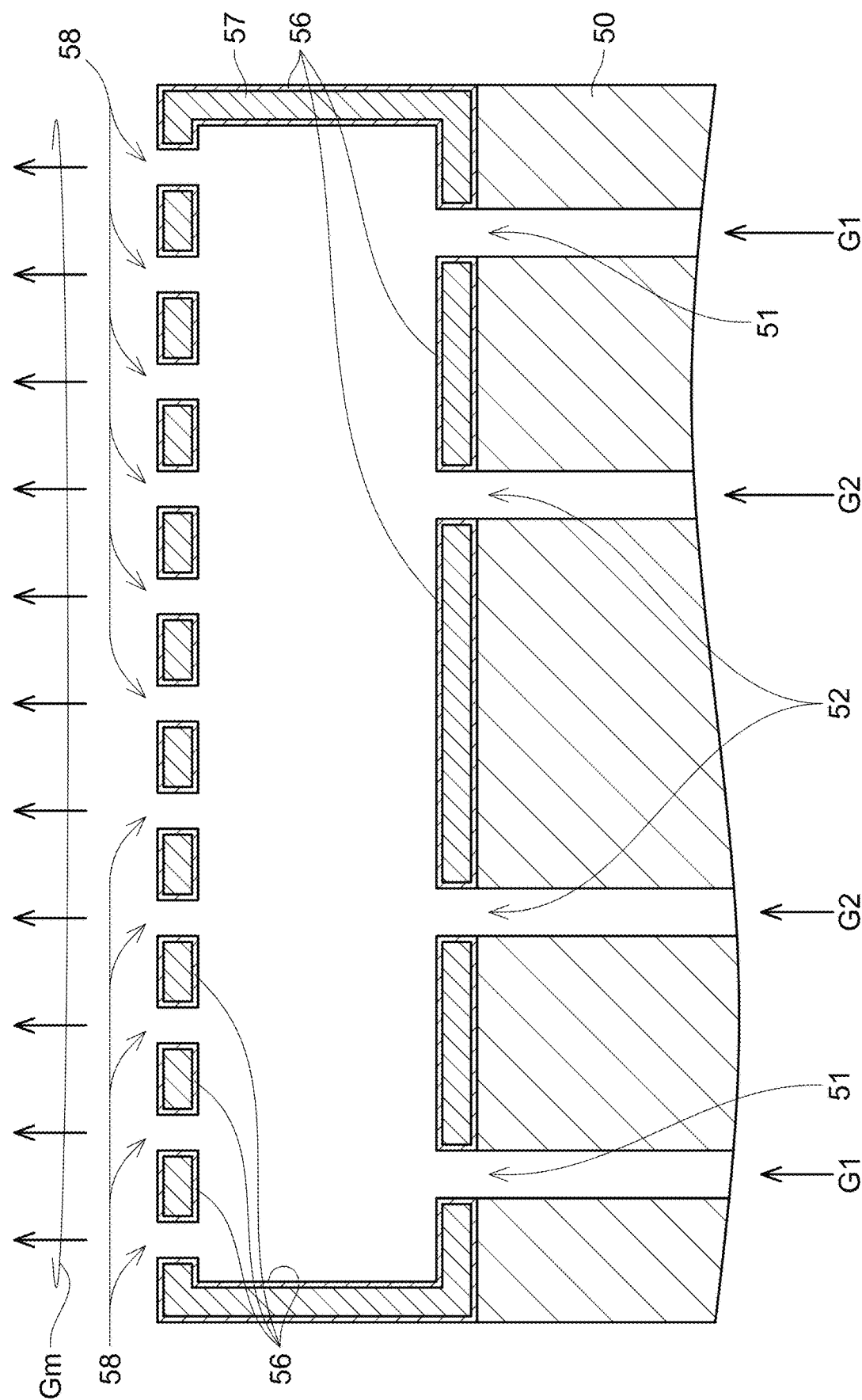

VAPOR PHASE EPITAXIAL GROWTH DEVICE

The present application is a national stage filing under 35 U.S.C. § 371 of PCT/JP2018/033324, filed on Sep. 7, 2018 which claims priorities to Japanese Patent Application No. 2017-183987 filed on Sep. 25, 2017, Japanese Patent Application No. 2018-92435 filed on May 11, 2018, and Japanese Patent Application No. 2018-92438 filed on May 11, 2018, the contents of which are hereby incorporated by reference into the present application. The description herein discloses an art related to a vapor phase epitaxial growth device of a compound semiconductor.

TECHNICAL FIELD

Background Art

Establishment of a low-cost manufacturing method of a GaN substrate is in demand. Currently, a single wafer processing method which grows the GaN substrate on one-by-one basis is dominant, and this has been a cause of high cost. A relevant technique is described in JP 2002-316892 A.

DISCLOSURE OF INVENTION

Technical Problem

If long GaN crystal growth is enabled, a plurality of wafers can be produced from a single long crystal, by which substrate manufacturing cost can be reduced. However, such long crystal growth of GaN is difficult. One of causes thereof is that dust generated during crystal growth adhere to a wafer surface, and this leads to abnormal growth.

Solution to Problem

The present description discloses a vapor phase epitaxial growth device. the device comprises a reactor vessel. The device comprises a wafer holder arranged within the reactor vessel. The wafer holder includes a wafer holding surface configured to hold a wafer with a wafer surface oriented substantially vertically downward. The device comprises a first material gas supply pipe configured to supply a first material gas into the reactor vessel. The first material gas supply pipe is arranged below the wafer holding surface. The device comprises a second material gas supply pipe configured to supply a second material gas, which reacts with the first material gas, into the reactor vessel. The second material gas supply pipe is arranged below the wafer holding surface. The device comprises a gas exhaust pipe configured to exhaust gases in the reactor vessel. The gas exhaust pipe is arranged below the wafer holding surface. The first material gas supply pipe, the second material gas supply pipe, and the gas exhaust pipe are arranged to extend along a substantially vertical direction. A distance between the gas exhaust pipe and an axis line passing through a center of the wafer holding surface and vertical to the wafer holding surface is greater than distances between the axis line and each of the first material gas supply pipe and the second material gas supply pipe.

The vapor phase epitaxial growth device disclosed herein can maintain the wafer surface oriented substantially vertically downward. Dust generated within the reactor vessel does not fall onto the wafer surface by gravity, by which the dust can be suppressed from adhering to the wafer surface. Further, in a case of exhausting the gases to an upper side with respect to the wafer, the dust having flowed up above the wafer by the exhausted gases might adhere to the wafer surface due to falling by gravity. In the vapor phase epitaxial device disclosed herein, the gas exhaust pipe is arranged below the wafer holding surface, by which the gases within the reactor vessel can be exhausted to a lower side with respect to the wafer. Since the dust does not flow up above the wafer, the dust can be suppressed from adhering to the wafer surface.

The vapor phase epitaxial growth device may comprise a first heater arranged around the wafer holder, the first material gas supply pipe, the second material gas supply pipe, and the gas exhaust pipe.

The vapor phase epitaxial growth device may comprise a partition wall arranged on a passage of the first material gas supply pipe passage and extending in a horizontal direction. The device may comprise first material gas generation unit configured to generate the first material gas, arranged below the partition wall, and having an inlet of the first material gas supply pipe connected thereto. The device may comprise a second heater arranged around the first material gas generation unit. The first heater may be arranged on an upper side with respect to the partition wall. The second heater may be arranged on a lower side with respect to the partition wall. The first heater may have a higher heating temperature than the second heater.

The vapor phase epitaxial growth device may comprise a shower head including a surface on which a plurality of first nozzles configured to supply the first material gas into the reactor vessel and a plurality of second nozzles configured to supply the second material gas into the reactor vessel are arranged. Outlets of the first material gas supply pipe and the second material gas supply pipe may be connected to the shower head. The surface of the shower head may be arranged at a position below the wafer holding surface and facing the wafer holding surface. The gas exhaust pipe may be arranged around the shower head.

The surface of the shower head may have a material not containing silicon nor oxygen arranged thereon.

The surface of the shower head may have a material containing tungsten arranged thereon.

Each of the plurality of first nozzles may include a first center hole configured to discharge the first material gas. Each of the plurality of first nozzles may include a first surrounding hole arranged around the first center hole and configured to discharge a particular gas. The second nozzle may include a second center hole configured to discharge the second material gas. The second nozzle may include a second surrounding hole arranged around the second center hole and configured to discharge the particular gas. The particular gas may be a gas not containing oxygen and is a gas that does not react with the first material gas nor with the second material gas.

The vapor phase epitaxial growth device may comprise a particular gas supply unit configured to supply a particular gas into the reactor vessel substantially vertically downward from above the wafer holder. The particular gas may be a gas not containing oxygen and is a gas that does not react with the first material gas nor with the second material gas.

The particular gas may be a gas containing at least one of hydrogen, nitrogen, helium, neon, argon, and krypton.

The surface of the wafer holder has a material not containing silicon nor oxygen arranged thereon.

A surface of the wafer holder may have a material containing tungsten arranged thereon.

The vapor phase epitaxial growth device may comprise a first heating unit. A surface of at least one of the first material gas supply pipe and the second material gas supply pipe in a region in a vicinity of a gas supply outlet may be covered with a particular metal. The particular metal may be a metal capable of decomposing the second material gas by a catalytic effect. The first heating unit may be configured to heat a surface of the particular metal to 800° C. or higher.

The vapor phase epitaxial growth device disclosed herein can increase the catalytic effect of the particular metal by heating the surface of the particular metal to 800° C. or higher. Accordingly, the second material gas can be decomposed on the surface(s) in the region in the vicinity of the gas supply outlet. Due to this, deposition of GaN polycrystal in the region in the vicinity of the gas supply outlet can be suppressed.

The vapor phase epitaxial growth device may comprise a shower head having a plurality of gas supply outlets of the first material gas supply pipe and a plurality of gas supply outlets of the second material gas supply pipe arranged thereon. A surface of the shower head at least on a gas supply outlet side may be covered with the particular metal.

The gas supply outlet may be arranged at ends of the first material gas supply pipe and the second material gas supply pipe. An inner wall and an outer wall of the first material gas supply pipe in a region in a vicinity of the end of the first material gas supply pipe on a gas supply outlet side may be covered with the particular metal. An inner wall and an outer wall of the second material gas supply pipe in a region in a vicinity of the end of the second material gas supply pipe on the gas supply outlet side may be covered with the particular metal.

An inner diameter of the second material gas supply pipe may be larger than an outer diameter of the first material gas supply pipe. The first material gas supply pipe may be arranged inside the second material gas supply pipe.

The first material gas supply pipe and the second material gas supply pipe may configure an integrated common pipe. The first material gas and the second material gas may be supplied to an inlet of the common pipe located opposite from the gas supply outlet. The common pipe may have an inner wall that is covered with the particular metal over an entire length from the inlet to the gas supply outlet. the device may comprise a second heating unit configured to heat the common pipe over the entire length from the inlet to the gas supply outlet to 800° C. or higher.

The vapor phase epitaxial growth device may comprise a third heating unit configured to heat a temperature of a region between the wafer holder and the gas supply outlet of the first material gas supply pipe and the second material gas supply pipe to 500° C. or higher.

The vapor phase epitaxial growth device may comprise a first supply unit configured to supply the first material gas to an inlet of the first material gas supply pipe located opposite from the gas supply outlet. The device may comprise a second supply unit configured to supply the second material gas to an inlet of the second material gas supply pipe located opposite from the gas supply outlet. The first supply unit and the second supply unit may be configured to supply the first material gas and the second material gas during a period in which the surface of the particular metal is 800° C. or higher.

The first supply unit and the second supply unit may be configured to start to supply the first material gas and the second material gas after the surface of the particular metal has been heated to 800° C. or higher by the first heating unit. The first heating unit may be configured to stop heating the surface of the particular metal after supplies of the first material gas and the second material have been stopped by the first supply unit and the second supply unit.

The particular metal may include tungsten, a metal containing tungsten, an oxide of tungsten, an oxide of metal containing tungsten, a carbide of tungsten, a carbide of metal containing tungsten, a nitride of tungsten, or a nitride of metal containing tungsten.

The vapor phase epitaxial growth device may comprise a ring unit including a hole corresponding to the wafer held by the wafer holding surface. The device may comprise an actuator configured to move at least one of the wafer holder and the ring unit along the axis line vertical to the wafer holding surface. The actuator may be configured to maintain a constant distance between a surface of the ring unit and a surface of a compound semiconductor crystal grown on the wafer.

In the vapor phase epitaxial growth device disclosed herein, the distance between the surface of the ring unit and the surface of the compound semiconductor crystal grown on the wafer can be maintained constant by the actuator. Due to this, even in a case where the crystal grows and a thickness thereof increases, flows of the first and second material gases at an outer peripheral portion of the wafer can be maintained constant. Thus, a uniform crystal can be obtained even when the crystal becomes thick. Further, by supporting an outer peripheral portion of the crystal by an inner wall surface of the ring unit, an end surface of the outer peripheral portion of the grown crystal can be configured as a surface vertical to a wafer surface. An occurrence of a crack in the grown crystal can be avoided.

The actuator may be configured to move the wafer holder to a surface side that is opposite from the wafer holding surface. A moving speed of the wafer holder may be equal to a growing speed of the compound semiconductor crystal in a thickness direction.

The actuator may be configured to maintain a state in which a distance from the wafer holding surface to the surface of the ring unit is greater than a distance from the wafer holding surface to the surface of the compound semiconductor crystal grown on the wafer by a predetermined distance.

The surface of the ring unit may be covered with a particular metal capable of decomposing the second material gas by a catalytic effect.

The particular metal may include tungsten, a metal containing tungsten, an oxide of tungsten, an oxide of metal containing tungsten, a carbide of tungsten, a carbide of metal containing tungsten, a nitride of tungsten, or a nitride of metal containing tungsten.

The gas supply outlet of the first and second material gas supply pipes may be arranged at a position facing the wafer holding surface. The actuator may be configured to move the wafer holder so as to maintain a constant distance between the gas supply outlet and the surface of the compound semiconductor crystal grown on the wafer.

The first material gas may be a gas containing GaCl. The second material gas may be a gas containing $NH_3$.

BRIEF DESCRIPTION OF DRAWINGS

FIG. 18 is a schematic cross-sectional view seeing a shower head provided with a mixing chamber along the lateral direction.

DESCRIPTION OF THE EMBODIMENTS

First Embodiment

<Configuration of Vapor Phase Epitaxial Growth Device>

Figure 1:
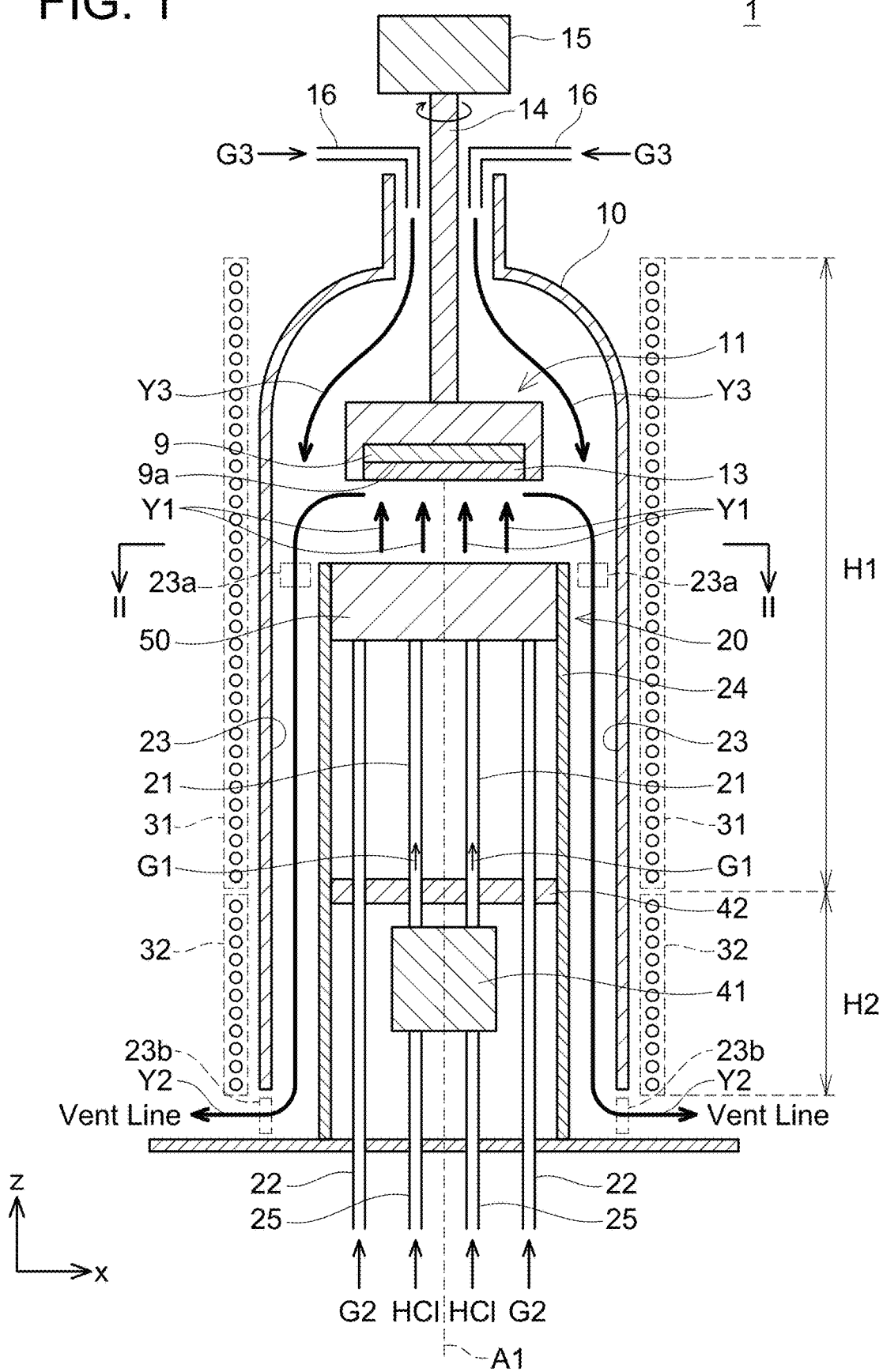
FIG. 1 is a schematic cross-sectional view seeing a vapor phase epitaxial growth device along a lateral direction.

FIG. 1 shows a schematic cross-sectional view seeing a vapor phase epitaxial growth device 1 according to an aspect of the art disclosed herein along a lateral direction. The vapor phase epitaxial growth device 1 is an example of a device configuration for implementing a HVPE (Hydride/Halide Vapor Phase Epitaxy) method. The vapor phase epitaxial growth device 1 is provided with a reactor vessel 10. The reactor vessel 10 has a cylindrical shape. The reactor vessel 10 may be constituted of quartz. A material gas supply unit 20 and a wafer holder 11 are arranged within the reactor vessel 10.

A structure of the material gas supply unit 20 will be described. The material gas supply unit 20 is a cylindrical member. The material gas supply unit 20 is provided with a cylindrical cover 24. A disk-shaped shower head 50 is arranged at an upper end of the cover 24. Inlets of HCl gas supply pipes 25 and inlets of second material gas supply pipes 22 are arranged at a lower portion of the material gas supply unit 20. A gas containing HCl is supplied to the inlets of the HCl gas supply pipes 25. Outlets of the HCl gas supply pipes 25 are connected to a first material gas generation unit 41. The first material gas generation unit 41 accommodates metal gallium therein. The first material gas generation unit 41 is a unit configured to generate a first material gas G1 containing GaCl. First material gas supply pipes 21 are pipes configured to supply the first material gas G1. Inlets of the first material gas supply pipes 21 are connected to the first material gas generation unit 41. Outlets of the first material gas supply pipes 21 are connected to the shower head 50. A gas containing a second material gas G2 is supplied to the inlets of the second material gas supply pipes 22. The second material gas G2 is a gas containing $NH_3$. Outlets of the second material gas supply pipes 22 are connected to the shower head 50.

The first material gas supply pipes 21 and the second material gas supply pipes 22 are arranged to extend in a vertical direction (i.e., a z-axis direction of FIG. 1). A partition wall 42 is arranged on passages of the first material gas supply pipes 21 and the second material gas supply pipes 22. The partition wall 42 is a quartz plate extending inside the cover 24 in a horizontal direction. A space inside the cover 24 is partitioned into upper and lower parts by the partition wall 42.

The shower head 50 is a unit configured to discharge the first material gas G1 and the second material gas G2 to a vicinity of a surface of a wafer 13. The first material gas G1 and the second material gas G2 discharged from the shower head 50 flows within the reactor vessel 10 in a direction of arrows Y1.

Figure 2:
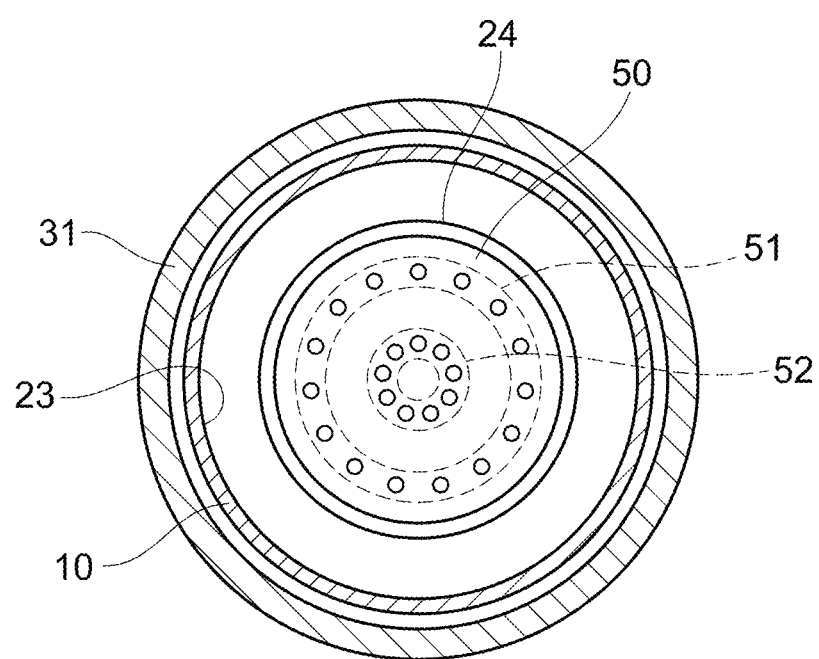
FIG. 2 is a view seeing a cross-section along a line II-II from vertically above.

A structure of the shower head 50 will be described with reference to FIGS. 2 and 3. FIG. 2 is a view seeing a cross-section along a line II-II of FIG. 1 from vertically above. A plurality of first nozzles 51 configured to discharge the first material gas G1 and a plurality of second nozzles 52 configured to discharge the second material gas G2 are arranged on a surface of the shower head 50. By discharging the first material gas G1 and the second material gas G2 from such a large number of nozzles, a gas supply amount to the surface of the wafer 13 can be uniformized thoroughly over a wafer plane. Due to this, a variation in a grown GaN crystal film thickness over the wafer plane can be suppressed.

A material that does not contain silicon and oxygen is arranged on the surface of the shower head 50. The material arranged on the surface of the shower head 50 is preferably a material that is stable in a high temperature environment and an ammonic atmosphere. In the present embodiment, a material containing tungsten is arranged on the surface of the shower head 50. Due to this, as a first effect, GaN polycrystal is suppressed from being deposited on the surface of the shower head 50. This is achieved due to a catalytic effect of tungsten. As a second effect, a temperature of the surface of the shower head 50 can be uniformized. This is achieved due to tungsten being metal with high thermal conductivity, which enables to transfer heat to a center of the shower head 50 when an outer periphery of the shower head 50 is heated by a first heater 31. As a third effect, a situation in which oxygen and silicon impurities are generated from the shower head 50 can be avoided. This is achieved due to covering the surface of the shower head 50 by tungsten, which is a material that does not contain silicon and oxygen.

Further, as shown in FIG. 2, an upper surface of the cover 24 is arranged at the outer periphery of the shower head 50. Due to this, the upper surface of the cover 24 functions as a part of the shower head 50. A material containing tungsten may be arranged also on this upper surface of the cover 24. By doing so, the GaN polycrystal is suppressed from being deposited on the upper surface of the cover 24.

Figure 3:
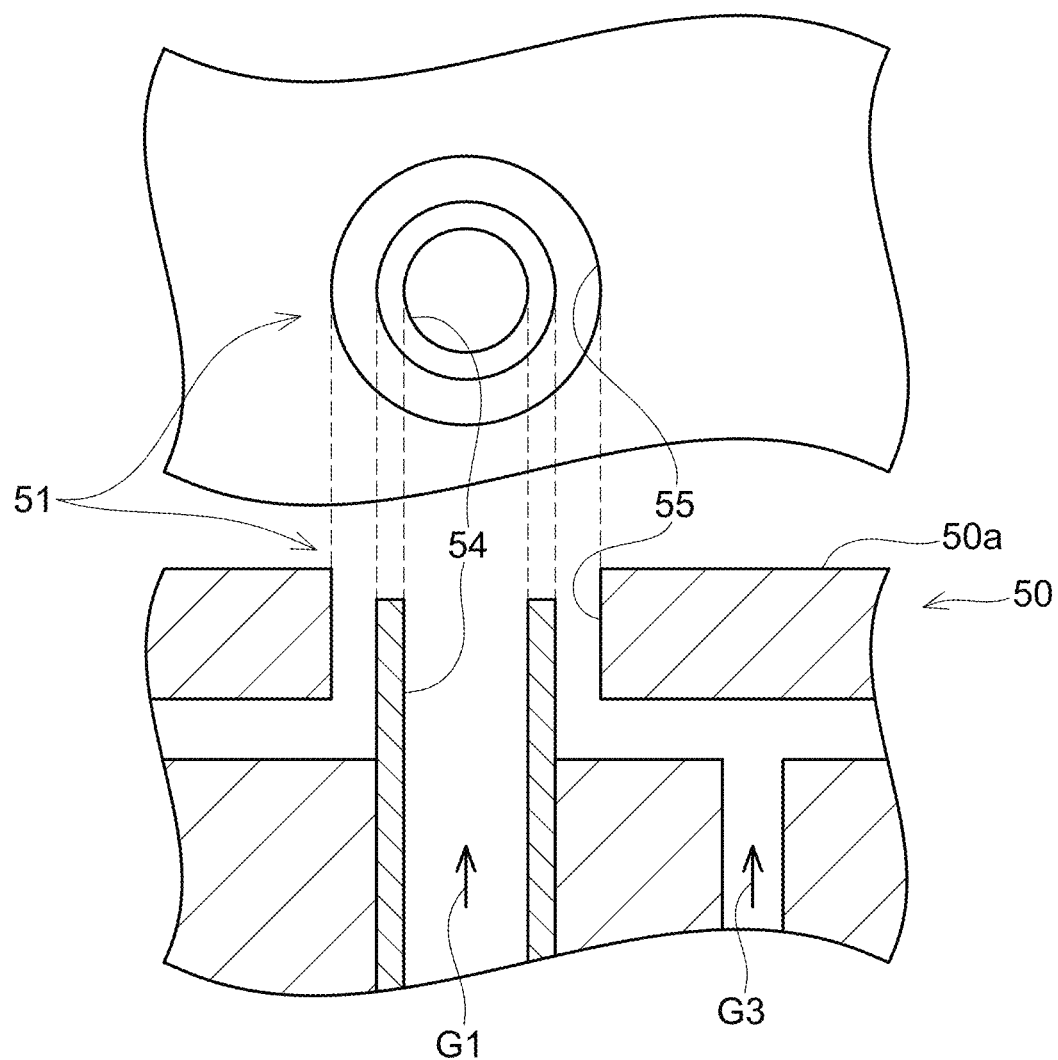
FIG. 3 is an enlarged view of an upper surface of a first nozzle and a cross-sectional view thereof.

FIG. 3 is an enlarged view of an upper surface of one first nozzle 51 and a cross-sectional view thereof. Each first nozzle 51 is provided with a center hole 54 configured to discharge the first material gas G1 and a surrounding hole 55 arranged around the center hole 54 and configured to discharge a particular gas G3. The particular gas G3 is a gas that does not contain oxygen, and is a gas that does not react with the first material gas G1 nor with the second material gas G2. As a specific example, the particular gas G3 is a gas containing at least one of hydrogen, nitrogen, helium, neon, argon, and krypton. For example, argon, which is an inert gas not containing N being a constituent element of a nitride semiconductor, and helium, which is an inert gas not containing H being is a constituent element of the second material gas G2, may be used to suppress unexpected reactions. Further, it is possible to improve an air-curtain function to be described later by configuring the particular gas G3 to contain argon, which has a larger atomic radius than nitrogen. A cross-sectional structure of the second nozzles 52 is same as that of the first nozzles 51 described in connection to FIG. 3. That is, each second nozzle 52 is provided with a center hole configured to discharge the second material gas G2 and a surrounding hole arranged around the center hole and configured to discharge the particular gas G3.

Due to this, a gas layer constituted of the particular gas G3 can be formed around the first material gas G1 discharged from each of the first nozzles 51 and around the second material gas G2 discharged from each of the second nozzles 52. The gas layer of the particular gas G3 function as an air curtain in a vicinity of a surface 50a of the shower head 50 but is sufficiently diffused in a vicinity of a surface of the wafer 13 thus does not function as an air curtain. As such, the first material gas G1 and the second material gas G2 do not mix in the vicinity of the surface 50a of the shower head 50 but mix in the vicinity of the surface of the wafer 13. Due to this, the GaN polycrystal can be suppressed from being deposited on the surface 50a of the shower head 50 and GaN monocrystal can be grown on the surface of the wafer 13.

Numbers and arrangement layouts of the first nozzles 51 and the second nozzles 52 may freely be set based on various parameters, such as necessary supply amounts of the gases and influences they impose on states of gas flows. Further, the surface of the shower head 50 may be partitioned into a plurality of zones and gas flow rates may individually controlled for each zone. Further, the first nozzles 51 and the second nozzles 52 may have various shapes. They may be circular, polygonal, or slit-like, for example.

A gas exhaust pipe 23 configured to exhaust the gases in the reactor vessel 10 is provided around the material gas supply unit 20. This will be described with reference to FIG. 2. FIG. 2 is a view seeing a cross section along a line II-II of FIG. 1 from vertically above. The cylindrical material gas supply unit 20 is further arranged inside the cylindrical reactor vessel 10. Due to this, a ring-shaped gap is defined between an inner wall of the reactor vessel 10 and an outer wall of the cover 24 of the material gas supply unit 20. This ring-shaped gap functions as the gas exhaust pipe 23. That is, the gas exhaust pipe 23 is arranged to extend vertically below (that is, along a z axis direction of FIG. 2) along the outer wall of the material gas supply unit 20 and the inner wall of the reactor vessel 10. According to this, the gas exhaust pipe 23 can be arranged to surround outer peripheries of the shower head 50, the first material gas supply pipes 21, and the second material gas supply pipes 22. In other words, a relationship as follows is established between the first material gas supply pipes 21, the second material gas supply pipes 22, and the gas exhaust pipe 23: "An axis line A1 (see FIG. 1) passing through a center of the wafer holding surface 9a and vertical to the wafer holding surface 9a is assumed. A distance between the axis line A1 and the gas exhaust pipe 23 is greater than distances between the axis line A1 and each of the first material gas supply pipes 21 and the second material gas supply pipes".

Further, an inlet 23a of the gas exhaust pipe 23 may be located on a lateral side surface of the shower head 50. As such, as shown by arrows Y2 in FIG. 1, the first material gas G1 and the second material gas G2 that were used for GaN crystal growth on the surface of the wafer 13 can be exhausted in a lateral side surface direction of the shower head 50 and a downward direction from the wafer 13. An outlet 23b of the gas exhaust pipe 23 is arranged at a lower end of the reactor vessel 10. Gases that are suctioned from the inlet 23a of the gas exhaust pipe 23 is discharged to a vent line from the outlet 23b.

Further, a distance from the inlet 23a to the outlet 23b can be made sufficiently long by arranging the inlet 23a of the gas exhaust pipe 23 on the lateral side surface of the shower head 50 and the outlet 23b thereof at the lower end of the reactor vessel 10. With this configuration, even in a case where the outlet 23b is provided in a part of the circular ring-shaped gas exhaust pipe 23, the gases can uniformly be suctioned from the inlet 23a at the outer periphery of the shower head 50. Due to this, an uneven flow of the gases can be suppressed.

The wafer holder 11 is arranged within the reactor vessel 10. The wafer holder 11 is provided with a wafer holder 9 on its lower surface. The wafer holder 9 is constituted of a material having high thermal conductivity. In the present embodiment, the wafer holder 9 is SiC crystal. Due to this, a temperature of the surface of the wafer 13 can be uniformized. This is achieved because SiC is a material with high thermal conductivity, and when an outer periphery of the wafer 13 is heated by the first heater 31, heat can be transmitted to a center of the wafer 13.

A wafer holding surface 9a is arranged on a lower surface of the wafer holder 9. The wafer holding surface 9a is configured to hold the wafer 13 such that the surface of the wafer 13 is oriented substantially vertically downward. Here, "oriented substantially vertically downward" refers to a direction along which dust having fallen by gravity does not fall on the wafer surface. As such, "oriented substantially vertically downward" is not limited to a configuration in which a normal line of the wafer matches a vertically downward direction. It is a concept that encompasses angled orientations with the normal line of the wafer being angled up to 45 degrees with respect to the vertically downward direction. The surface of the shower head 50 is arranged below the wafer holding surface 9a of the wafer holder 11 at a position facing the wafer holding surface 9a.

A material that does not contain silicon and oxygen is arranged on a surface of the wafer holder 11. In the present embodiment, a material containing tungsten is arranged on the surface of the wafer holder 11. Due to this, an effect of suppressing deposition of the GaN polycrystal on the surface of the wafer holder 11, an effect of uniformizing a temperature of the surface of the wafer holder 11, and an effect of suppressing generation of oxygen and silicon impurities are achieved. Reasons therefor are same as the contents described earlier in connection to the shower head 50.

A lower end of a rotary shaft 14 is connected to an upper portion of the wafer holder 11. An upper end of the rotary shaft 14 protrudes outside the reactor vessel 10. The upper end of the rotary shaft 14 is connected to an actuator 15. Due to this, the wafer holder 11 can be rotated and moved up and down within the reactor vessel 10.

Particular gas supply pipes 16 are provided at an upper portion of the reactor vessel 10. The particular gas G3 is supplied to inlets of the particular gas supply pipes 16. The particular gas G3 flows vertically downward from above the wafer holder 11 as shown by arrows Y3 in FIG. 1 and is suctioned into the inlet 23a of the gas exhaust pipe 23. Due to this, a downflow can be generated by the particular gas G3.

An effect will be described. The downflow of the particular gas G3 suppresses the first material gas G1, the second material gas G2, and reaction products from rising above the wafer holder 11. Due to this, the upper portion of the wafer holder 11 is suppressed from being contaminated by GaN polycrystal and reaction products. An occurrence of a situation in which dust falls from above the wafer holder 11 can be suppressed. Further, since contamination of the rotary shaft 14 and its rotary mechanism arranged at the upper portion of the wafer holder 11 can be suppressed, a rotary operation of the wafer holder 11 can be stabilized.

The first heater 31 and a second heater 32 are arranged outside the reactor vessel 10. The first heater 31 is arranged on an upper side with respect to the partition wall 42. The first heater 31 is arranged to around the wafer holder 11, first material gas supply pipes 21, the second material gas supply pipes 22, and the gas exhaust pipe 23. The second heater 32 is arranged on a lower side with respect to the partition wall 42. The second heater 32 is arranged around the first material gas generation unit 41.

<Vapor Phase Epitaxy Method>

A method of executing vapor phase epitaxy of a GaN layer on the wafer 13 by a HVPE method will be described. An example of a vapor phase epitaxial condition will be listed. Supply amounts of GaCl in the first material gas G1 and NH$_3$ in the second material gas G2 are set to a mole ratio of 1:20. A pressure inside the reactor vessel 10 is set to 1000 hPa and a pressure at the outlet 23b of the gas exhaust pipe 23 is set to 990 hPa.

Figure 4:
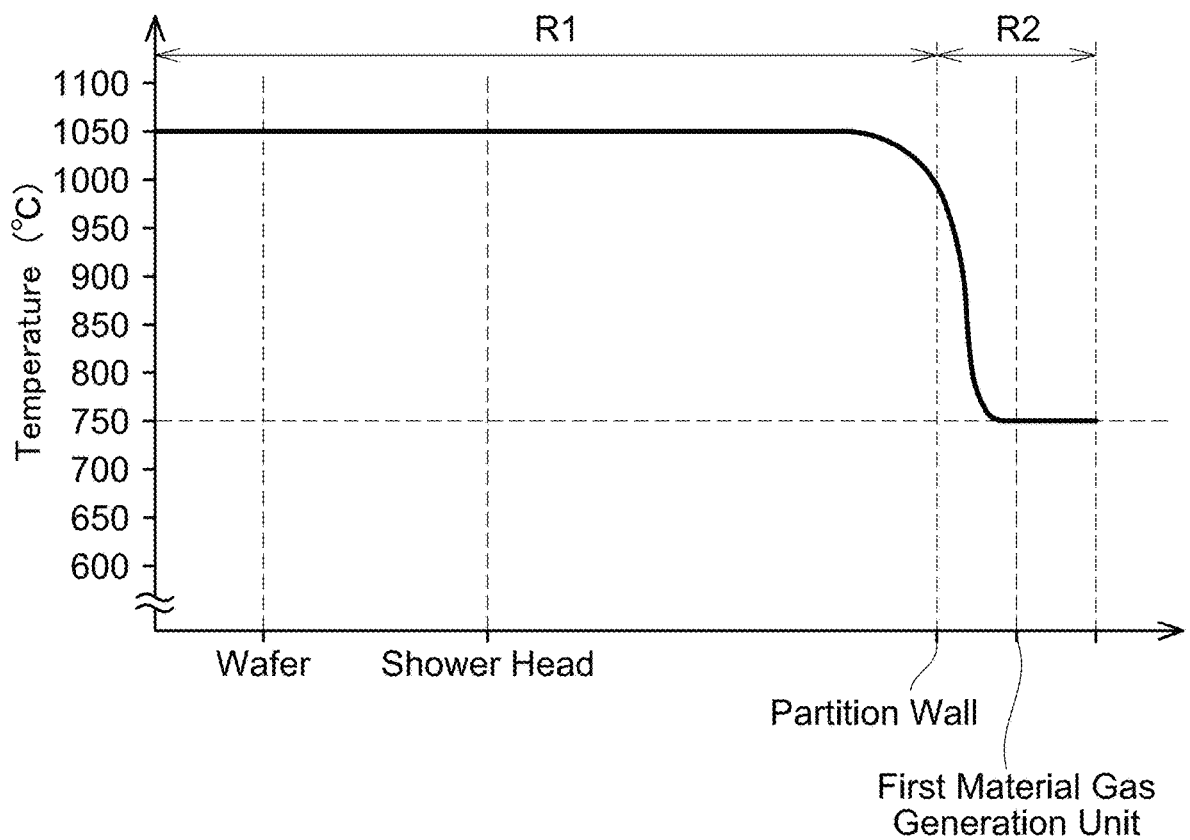
FIG. 4 shows a temperature distribution.

As shown in FIG. 1, the partition wall 42 is arranged in a vicinity of a boundary between a region H1 where the first heater 31 is arranged and a region H2 where the second heater 32 is arranged. The partition wall 42 functions as a heat insulator. As such, a heating temperature can be controlled individually for each region with the partition wall 42 as the boundary. In the present embodiment, the first heater 31 is set to have a higher heating temperature than the second heater 32. Due to this, a temperature distribution as shown in FIG. 4 is realized. In FIG. 4, a horizontal axis indicates a positional relationship of the respective members in the vertical direction and a vertical axis indicates a temperature. The wafer 13 can be heated to a temperature that is sufficient for GaN crystal growth (1050±50° C.) by using the first heater 31. Further, the first material gas generation unit 41 can be heated to a temperature that is necessary for generation of GaCl (750° C. or higher) by using the second heater 32. The heating temperatures of the wafer 13 and of the first material gas generation unit 41 have a temperature difference of about 300° C., however, due to the partition wall 42 functioning as the heat insulator, a distance between the wafer 13 and the first material gas generation unit 41 can be designed short while maintaining this temperature difference. Due to this, a size reduction of the vapor phase epitaxial growth device 1 can be achieved.

<Effect>

In the HVPE method, it is difficult to grow a long crystal (which may also be termed a thick crystal) on a C-plane of GaN. This is due to a difficulty in suppressing occurrence of abnormal growth. Following three factors may be exemplified as causes of such abnormal growth. The first factor is the dust generated in the reactor vessel falling onto the wafer surface by gravity. The second factor is occurrences of gas pipe clogs and changes in gas flows caused by the deposition of the GaN polycrystal on the first nozzles 51 and the second nozzles 52 of the shower head 50. The third factor is an occurrence of changes in gas flows caused by ammonium chloride powder blocking the gas exhaust pipe 23 and the like.

As a countermeasure to the first factor, the wafer holder 11 in the description herein is configured to hold the surface of the wafer 13 oriented substantially vertically downward. Since the dust generated in the reactor vessel 10 does not fall onto the surface of the wafer 13 by gravity, the dust can be suppressed from adhering to the surface of the wafer 13. Further, in a case of exhausting the gases to an upper side with respect to the wafer 13, the dust having flowed up above the wafer by the exhausted gases might adhere to the surface of the wafer 13 due to falling by gravity. In the vapor phase epitaxial growth device 1 in the description herein, since the gas exhaust pipe 23 is arranged below the wafer holding surface 9a, the gases within the reactor vessel 10 can be exhausted to a lower side with respect to the wafer 13. Since the dust does not flow up above the wafer 13, the dust can be suppressed from adhering to the surface of the wafer 13.

As a countermeasure to the second factor, the material containing tungsten is arranged on the surface of the shower head 50. Further, the surrounding holes 55 configured to discharge the particular gas G3 are arranged around the center holes 54 configured to discharge the first material gas G1 and the second material gas G2. Due to this, the deposition of the GaN polycrystal on the surface of the shower head 50 can be suppressed by the catalytic effect and the air curtain function.

As a countermeasure to the third factor, the first heater 31 is arranged to surround the wafer holder 11, the first material gas supply pipes 21, the second material gas supply pipes 22, and the gas exhaust pipe 23. Due to this, the gas exhaust pipe 23 can be heated simultaneously when the wafer 13 held by the wafer holder 11 is heated. The heating temperature of the wafer 13 (about 1050° C.) is sufficiently higher than a temperature at which the ammonium chloride powder, which is a byproduct, is generated in the gas exhaust pipe 23 (about 200° C.), thus the ammonium chloride powder is suppressed from clogging within the gas exhaust pipe 23.

Second Embodiment

<Configuration of Vapor Phase Epitaxial Growth Device>

Figure 5:
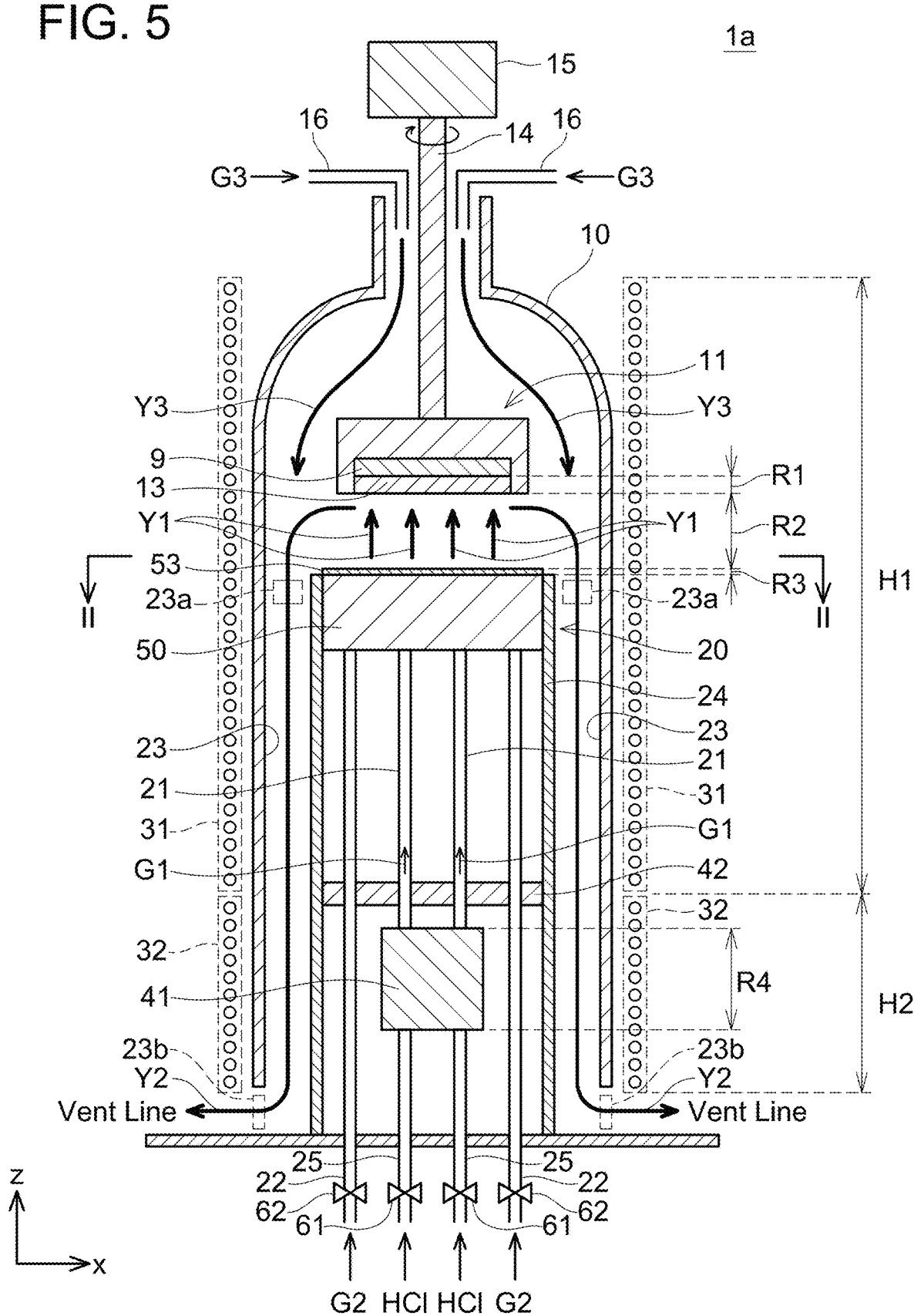
FIG. 5 is a schematic cross-sectional view seeing a vapor phase epitaxial growth device according to a second embodiment along the lateral direction.

FIG. 5 shows a schematic cross-sectional view seeing a vapor phase epitaxial growth device 1a according to an aspect of the art disclosed herein along a lateral direction. Since members having same reference signs between the vapor phase epitaxial growth device 1a of FIG. 5 and the vapor phase epitaxial growth device 1 of FIG. 1 are identical, description thereof will be omitted.

A first valve 61 is arranged at an inlet of each of HCl gas supply pipes 25. The first valves 61 are configured to control supplies of a gas containing HCl. A second valve 62 is arranged at an inlet of each of second material gas supply pipes 22. The second valves 62 are configured to control supplies of a gas containing a second material gas G2. A partition wall 42 functions as a heat insulator.

FIG. 2 is a view seeing a cross-section along a line II-II in FIG. 5 from vertically above. Regions on a surface of a shower head 50 where first nozzles 51 and second nozzles 52 are not provided are covered with a particular metal 53. In other words, surfaces of the regions in a vicinity of the first nozzles 51 and the second nozzles 52 is covered with the particular metal 53. The particular metal 53 is a substance capable of decomposing $NH_3$ contained in the second material gas by a catalytic effect. The particular metal 53 may be constituted of a metal plate with a thickness of several millimeters. A plurality of holes corresponding to positions and hole diameters of the first nozzles 51 and the second nozzles 52 may be provided in the metal plate. In the present embodiment, tungsten is used as the particular metal.

A first heater 31 and a second heater 32 are arranged outside a reactor vessel 10. The partition wall 42 is arranged in a vicinity of a boundary between a region H1 where the first heater 31 is arranged and a region H2 where the second heater 32 is arranged. The first heater 31 is arranged around regions R1 to R3 shown in FIG. 5. The region R1 is a region including a wafer 13. The region R1 is a region in which a temperature sufficient for GaN crystal growth (1050±50° C.) needs to be maintained. The region R2 is a region between the nozzles of the shower head 50 and the wafer holder 11. The region R2 is a region that needs to be maintained to 500° C. or higher so that GaCl in a material gas does not decompose. The region R3 is a region including the particular metal 53 covering the surface of the shower head 50. The region R3 is a region that needs to be maintained to 800° C. or higher to suppress deposition of GaN polycrystal.

The second heater 32 is arranged around a region R4. The region R4 is a region including a first material gas generation unit 41. The region R4 is a region in which a temperature necessary for stable generation of GaCl (750° C.) or higher.

<Vapor Phase Epitaxy Method>

A method of executing vapor phase epitaxy of a GaN layer on the wafer 13 by the HVPE method will be described. A vapor phase epitaxial condition is same as the condition aforementioned in connection to the first embodiment.

In a first step, the first heater 31 is turned on. The region R1 (wafer 13), the region R2 (region between the nozzles and the wafer holder 11), and the region R3 (particular metal 53) are heated to 1050±50° C. Due to this, all of the regions R1 to R3 can be maintained at their required temperatures or higher by the first heater 31. Further, by turning on the second heater 32, the region R4 (first material gas generation unit 41) is heated to 750° C.

When a surface of the particular metal 53 has reached 800° C., the process proceeds to a second step. A timing of transition to the second step may be determined by measuring the surface temperature of the particular metal 53 by using various sensors. In the second step, the first valves 61 and the second valves 62 are opened to start supplies of the first material gas G1 and the second material gas G2. Due to this, the vapor phase epitaxy of the GaN layer on the wafer 13 can be executed. When the vapor phase epitaxy is completed, the process proceeds to a third step, and closes the first valves 61 and the second valves 62. The supplies of the first material gas G1 and the second material gas G2 are terminated. After this, the process proceeds to a fourth step, and the first heater 31 and the second heater 32 are turned off. Due to this, heating of the surface of the particular metal 53 is completed.

<Effect>

In the HVPE method, it is difficult to grow a long crystal (which may also be termed a thick crystal) on a C-plane of GaN. This is due to a difficulty in suppressing occurrence of abnormal growth. As a factor of the occurrence of abnormal growth, ocurrences of gas pipe clogs and changes in gas flows caused by the deposition of the GaN polycrystal on the first nozzles 51 and the second nozzles 52 arranged on the surface of the shower head 50 may be exemplified. As a countermeasure thereto, the surface of the shower head 50 may be covered with a particular metal capable of decomposing $NH_3$ by the catalytic effect (such as tungsten).

However, the inventors of the present invention have found that, in order to suppress the deposition of the GaN polycrystal, covering the surface of the shower head 50 with the particular metal is not sufficient, and the surface temperature of the particular metal needs to be heated to 800° C. or higher. This is assumed as being due to active hydrogen generated by decomposition of $NH_3$ by the catalytic effect suppressing the deposition of the GaN polycrystal. Further, in order for the active hydrogen to react with the GaN polycrystal, it is assumed that a temperature therefor needs to be 800° C. or higher. As such, the vapor phase epitaxial growth device 1a of the second embodiment is provided with the first heater 31 that surrounds the region R3 including the particular metal 53. Due to this, the surface of the particular metal can be heated to 800° C. or higher, and it becomes possible to suppress the deposition of the GaN polycrystal on the surface of the shower head 50.

In the vapor phase epitaxy method of the second embodiment, the supplies of the first material gas G1 and the second material gas G2 are started when the surface of the particular metal 53 has reached 800° C. or higher (second step). Further, after having closed the first valves 61 and the second valves 62 in the third step, the first heater 31 is turned off in the fourth step. The first valves 61 and the second valves 62 can be controlled according to the above process flow to "supply the first material gas G1 and the second material gas G2 in a period during which the surface of the particular metal 53 is 800° C. or higher". Thus, the GaN polycrystal can be suppressed from being deposited on the surface of the shower head 50.

Third Embodiment

Figure 6:
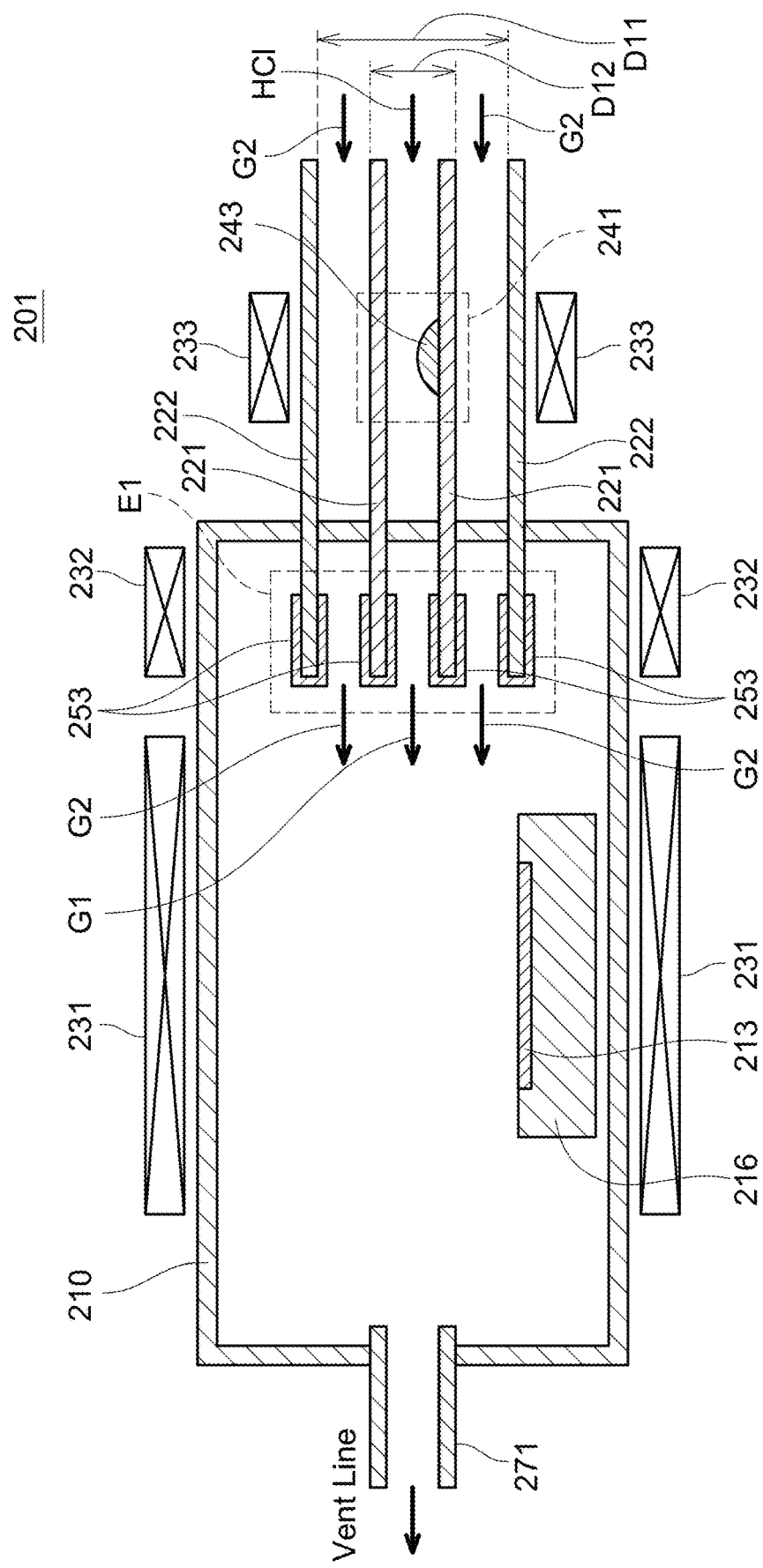
FIG. 6 is a schematic cross-sectional view seeing a vapor phase epitaxial growth device according to a third embodiment along the lateral direction.

FIG. 6 is a schematic cross-sectional view seeing a vapor phase epitaxial growth device 201 according to a third embodiment along the lateral direction. The vapor phase epitaxial growth device 201 is an example of a device configuration for implementing the HVPE method. The vapor phase epitaxial growth device 201 is provided with a reactor vessel 210, a susceptor 216, a first material gas supply pipe 221, a second material gas supply pipe 222, and a gas exhaust pipe 271. The susceptor 216 is accommodated within the reactor vessel 210. A wafer 213 is held on a wafer holding surface of the susceptor 216.

The reactor vessel 210 has the first material gas supply pipe 221 configured to supply a first material gas G1 and the second material gas supply pipe 222 configured to supply a second material gas G2 connected thereto. An inner diameter D11 of the second material gas supply pipe 222 is larger than an outer diameter D12 of the first material gas supply pipe 221. The first material gas supply pipe 221 is arranged inside the second material gas supply pipe 222. A gap is defined between an outer wall of the first material gas supply pipe 221 and an inner wall of the second material gas supply pipe 222, and the second material gas G2 flows in this gap. An end region E1 of the first material gas supply pipe 221 and the second material gas supply pipe 222 functions as nozzles. Inner walls and outer walls of the first material gas supply pipe 221 and the second material gas supply pipe 222 are covered with particular metals 253 in a vicinity of the end region E1.

A first material gas generation unit 241 is arranged on a passage of the first material gas supply pipe 221. Metal gallium 243 is accommodated within the first material gas generation unit 241. A HCl gas is supplied to an inlet of the first material gas supply pipe 221 and the first material gas G1 is discharged from a nozzle thereof. The second material gas G2 is supplied to an inlet of the second material gas supply pipe 222 and the second material gas G2 is discharged from a nozzle thereof. The gas exhaust pipe 271 is connected to the reactor vessel 210. Material gases used for vapor phase epitaxy of GaN are discharged to a vent line through the gas exhaust pipe 271.

A heater 231 is arranged around the susceptor 216 at an outer periphery of the reactor vessel 210. The heater 231 is a device configured to heat the wafer 213 by a hot wall scheme. Due to this, the wafer 213 can be maintained at a temperature sufficient for GaN crystal growth (1050±50° C.). Further, deposition of byproducts on an inner wall of the reactor vessel 210 can be suppressed. A heater 232 is arranged around the end region E1 outside the reactor vessel 210. Due to this, the particular metals 253 arranged in the end region E1 can be maintained to 800° C. or higher. A heater 233 is arranged around the first material gas generation unit 241 outside the second material gas supply pipe 222. Due to this, the first material gas generation unit 241 can be maintained to 750° C. or higher to generate GaCl.

<Effect>

The vapor phase epitaxial growth device 201 of the third embodiment is provided with the heater 232 that surrounds the particular metals 253 arranged in the vicinity of the nozzles (end region E1). Due to this, surfaces of the particular metals 253 can be heated to 800° C. or higher, by which deposition of GaN polycrystal onto the nozzles can be suppressed.

Fourth Embodiment

Figure 7:
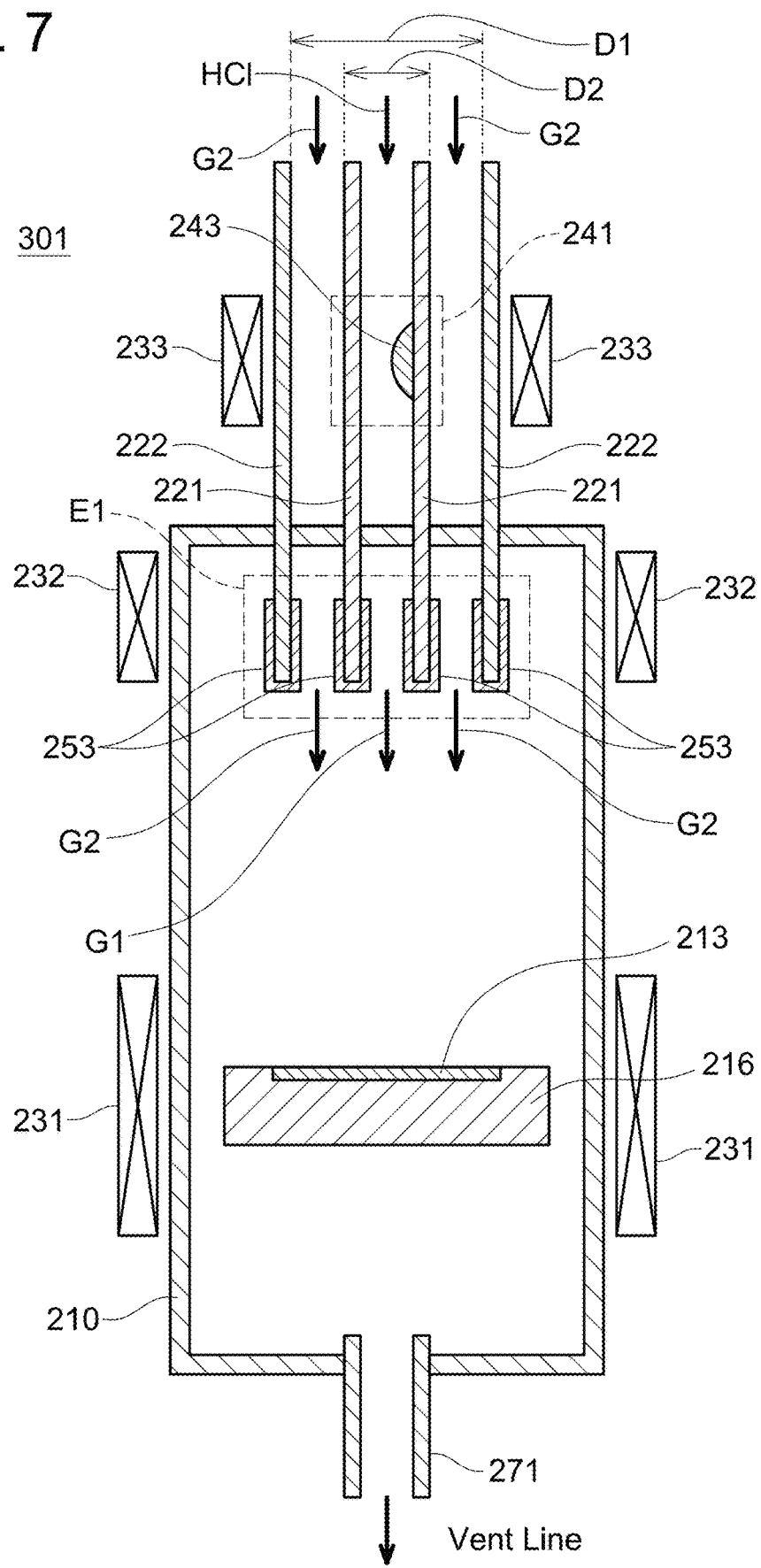
FIG. 7 is a schematic cross-sectional view seeing a vapor phase epitaxial growth device according to a fourth embodiment along the lateral direction.

FIG. 7 is a schematic cross-sectional view seeing a vapor phase epitaxial growth device 301 according to a fourth embodiment along the lateral direction. The vapor phase epitaxial growth device 301 of the fourth embodiment has a configuration in which positions of a first material gas supply pipe 221 and a second material gas supply pipe 222 are moved from a side of a right side surface of a wafer to above the wafer as compared to the vapor phase epitaxial growth device 201 of the third embodiment. Further, it has a configuration in which a position of a gas exhaust pipe 271 is moved from a side of a left side surface of the wafer to below the wafer. Members being same as those of the vapor phase epitaxial growth device 201 of the third embodiment are given same reference signs, and detailed description thereof will be omitted.

In the vapor phase epitaxial growth device 301 of the fourth embodiment as well, surfaces of particular metals 253 can be heated to 800° C. or higher by a heater 232. Due to this, deposition of GaN polycrystal on nozzles can be suppressed.

Fifth Embodiment

Figure 8:
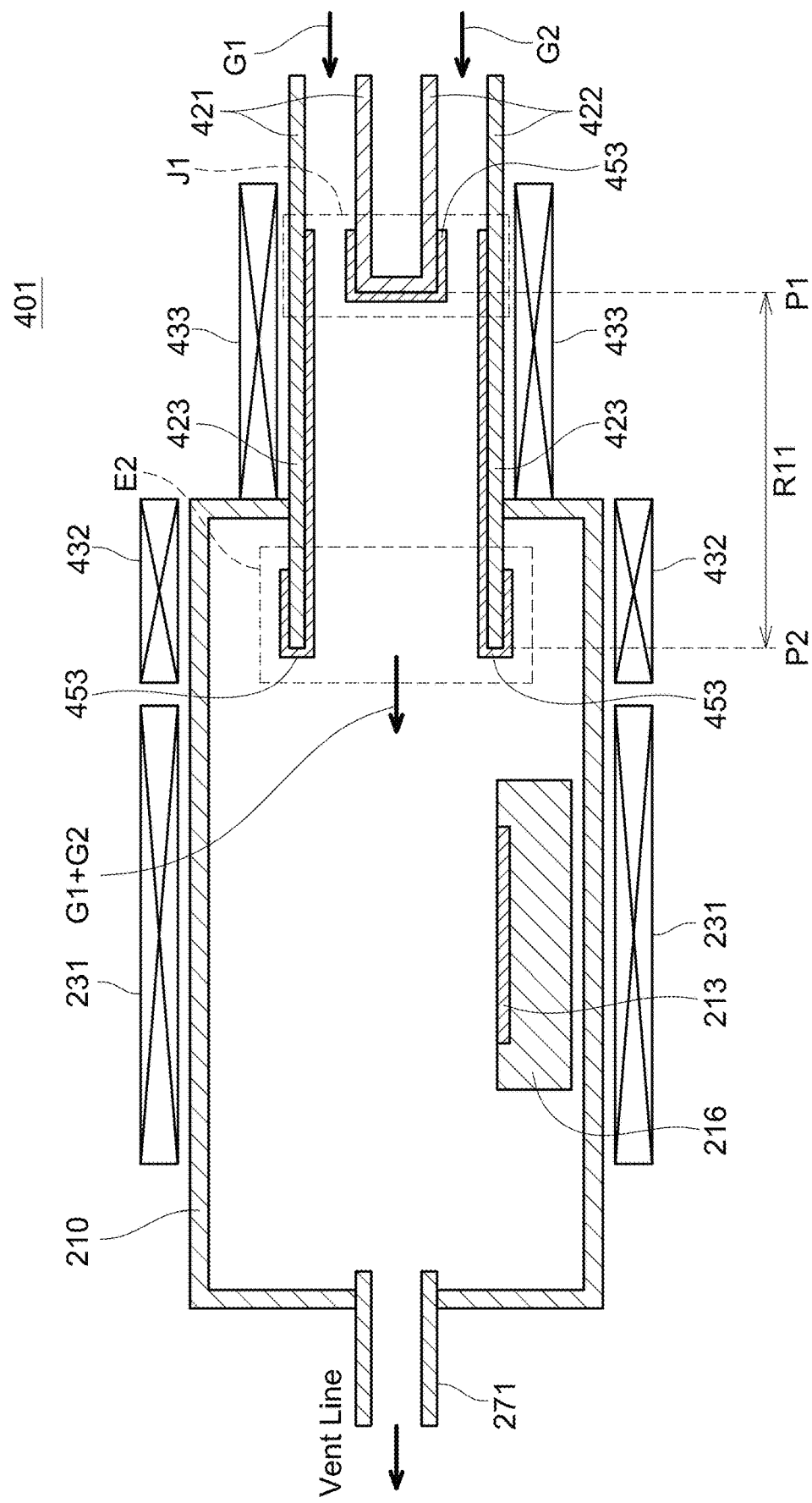
FIG. 8 is a schematic cross-sectional view seeing a vapor phase epitaxial growth device according to a fifth embodiment along the lateral direction.

FIG. 8 is a schematic cross-sectional view seeing a vapor phase epitaxial growth device 401 according to a fifth embodiment along the lateral direction. The vapor phase epitaxial growth device 401 of the fifth embodiment has a configuration in which a common pipe 423 is provided as compared to the vapor phase epitaxial growth device 201 of the third embodiment. Same reference signs are given to members that are same as those of the vapor phase epitaxial growth device 201 of the third embodiment, and detailed description thereof will be omitted.

A first material gas supply pipe 421 and a second material gas supply pipe 422 are connected to the common pipe 423 at a junction J1. In other words, the first material gas supply pipe 421 and the second material gas supply pipe 422 configure an integrated common pipe 423. An end region E2 of the common pipe 423 functions as a nozzle.

In the common pipe 423, a position of inlets of a first material gas G1 and a second material gas G2 are termed a position P1. Further, a position of the nozzle is termed a position P2. A region extending from the position P1 to the position P2 is termed a region R11. The common pipe 423 has an inner wall covered with a particular metal 453 over its entire region including the region R11. Further, in a vicinity of the end region E2, the inner wall and an outer wall of the common pipe 423 are covered with the particular metal 453.

The first material gas G1 is supplied to an inlet of the first material gas supply pipe 421 and the second material gas G2 is supplied to an inlet of the second material gas supply pipe 422. The first material gas G1 and the second material gas G2 are mixed within the common pipe 423 and a mixed gas is discharged from the nozzle of the common pipe 423.

Heaters 432 and 433 are arranged to surround the common pipe 423 over an entire length of the region R11. Due to this, the particular metal 453 can be maintained to 800° C. or higher over the entire region including the region R11.

<Effect>

In the vapor phase epitaxial growth device 401 of the fifth embodiment, the first material gas G1 and the second material gas G2 can be mixed by using the region R11 from the position P1 to the position P2 of the common pipe 423. Since sufficient distance and time for mixing these gases can be secured, these gases can be discharged from the nozzle of the common pipe 423 in a well-mixed state. Excellent GaN crystal can be grown at a fast speed, and this is advantageous in cost reduction. Further, when sufficient distance and time for mixing these gases are ensured, there is a risk that GaN polycrystal is deposited on the inner wall of the common pipe 423. To address this, in the vapor phase epitaxial growth device 401 of the fifth embodiment, the surface of the particular metal 453 on the inner wall of the common pipe 423 can be heated to 800° C. or higher over the entire length of the common pipe 423 by using the heaters 432 and 433. Deposition of the GaN polycrystal on the inner wall of the common pipe 423 can be suppressed.

Sixth Embodiment

<Configuration of Vapor Phase Epitaxial Growth Device>

Figure 9:
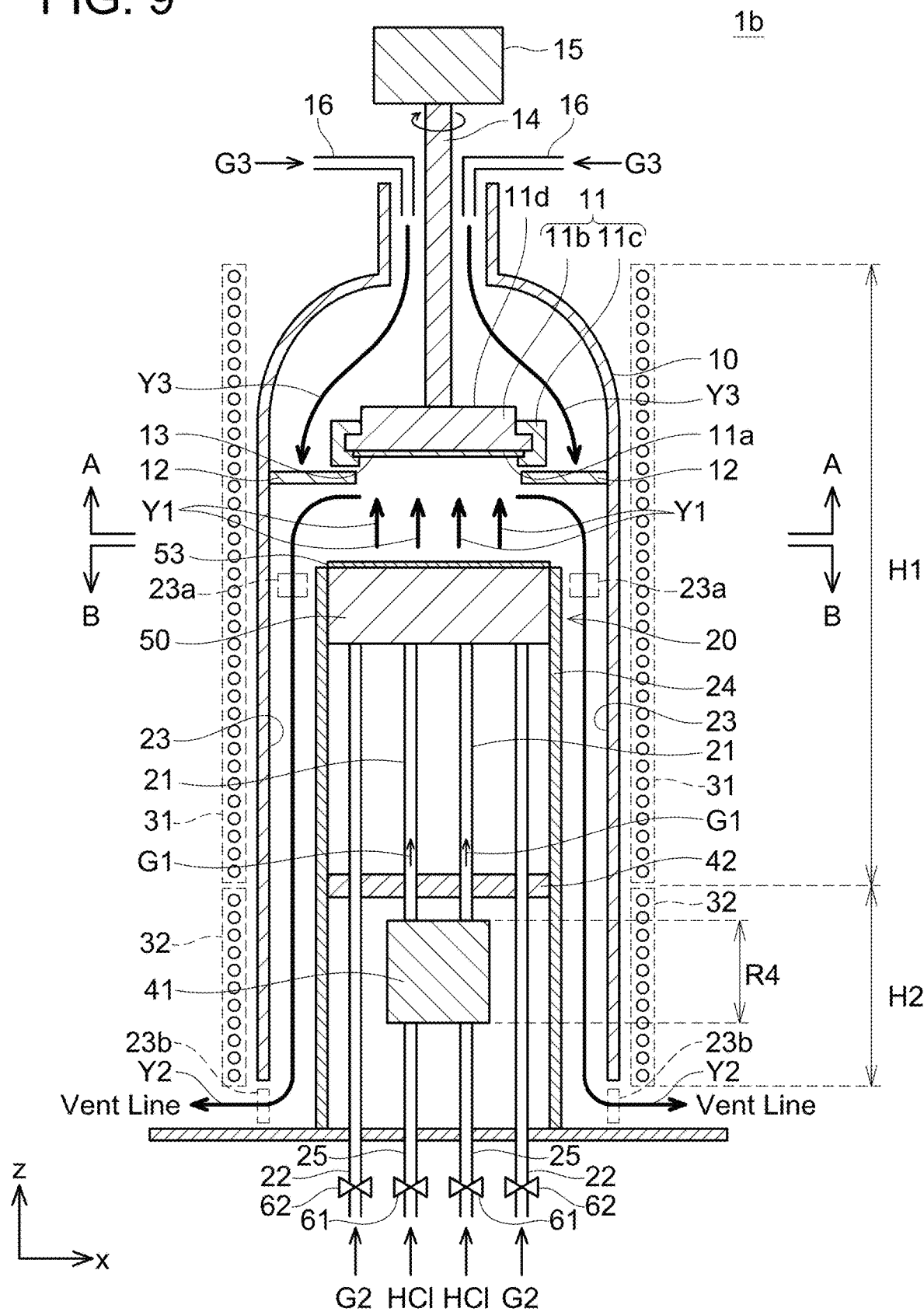
FIG. 9 is a schematic cross-sectional view seeing a vapor phase epitaxial growth device according to a sixth embodiment along the lateral direction.

FIG. 9 is a schematic cross-sectional view seeing a vapor phase epitaxial growth device 1b according to an aspect of art disclosed herein along the lateral direction. In the vapor phase epitaxial growth device 1b of FIG. 9, members being same as those of the vapor phase epitaxial growth device 1 of FIG. 1 and the vapor phase epitaxial growth device 1a of FIG. 5 are given same reference signs, and detailed description thereof will be omitted.

Figure 10:
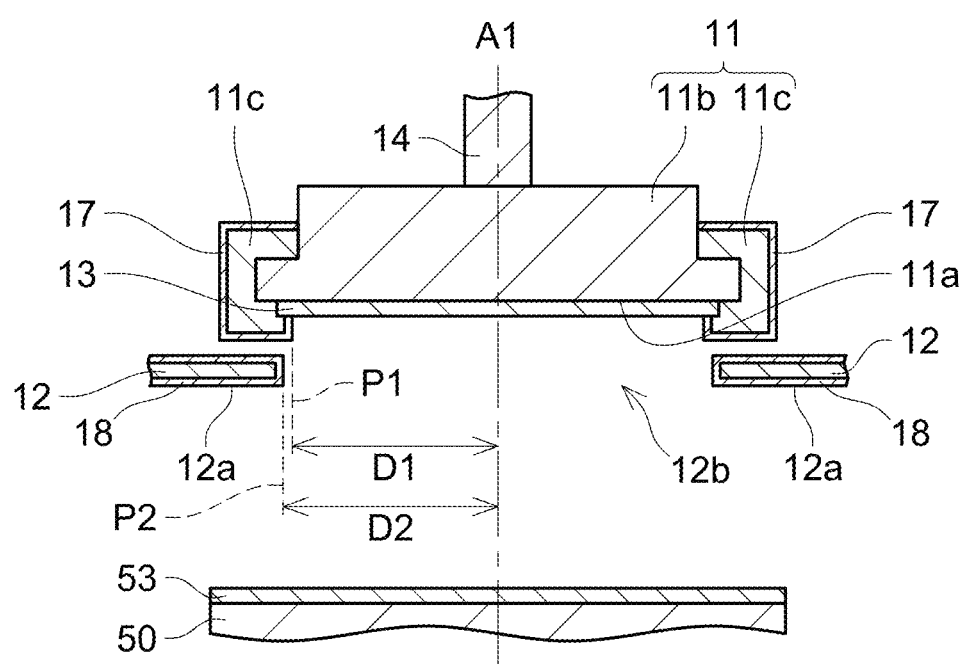
FIG. 10 is a partially enlarged view of a cross-section of a wafer holder, a ring plate, and a shower head.

FIG. 10 is a partially enlarged view of a cross-section of a wafer holder 11, a ring plate 12, and a shower head 50. The wafer holder 11 includes a holder body 11b and a supporting portion 11c. A wafer holding surface 11a is provided on a lower surface of the wafer holder 11. The supporting portion 11c of the wafer holder 11 is configured to hold a wafer 13 such that a surface of the wafer 13 is oriented substantially vertically downward. The wafer 13 is a base substrate for growing GaN monocrystal, and is GaN monocrystal. The surface of the wafer 13 is a +c-plane (also termed a (0001) plane).

A surface of the supporting portion 11c is covered with a particular metal 17. The particular metal 17 is a metal capable of decomposing a second material gas G2 by a catalytic effect. In the present embodiment, a material containing tungsten is used as the particular metal 17. Due to this, an effect of suppressing deposition of GaN polycrystal on the surface of the supporting portion 11c is obtained. This is achieved by active hydrogen generated by decomposition of $NH_3$ by the catalytic effect suppressing deposition of the GaN polycrystal.

A ring plate 12 is arranged below the wafer holder 11. A surface of the ring plate 12 is covered with a particular metal 18. The particular metal 18 is a metal capable of decomposing the second material gas G2 by a catalytic effect. In the present embodiment, a material containing tungsten is used as the particular metal 18. Due to this, an effect of suppressing deposition of GaN polycrystal on the surface of the ring plate 12 is obtained.

A lower surface 12a of the ring plate 12 is a surface corresponding to the wafer holding surface 11a. In the present embodiment, the lower surface 12a is a surface parallel to the wafer holding surface 11a. The ring plate 12 is provided with a hole 12b corresponding to the wafer 13 held by the wafer holding surface 11a. Here, a center axis of the wafer holder 11 is assumed as A1. A position of an inner wall 11cw of the supporting portion 11c is assumed as a position P1. A position of an inner wall 12w defining the hole 12b of the ring plate 12 is assumed as a position P2. A distance D2 from the center axis A1 to the position P2 may be equal to or greater than a distance D1 from the center axis A1 to the position P1.

Figure 11:
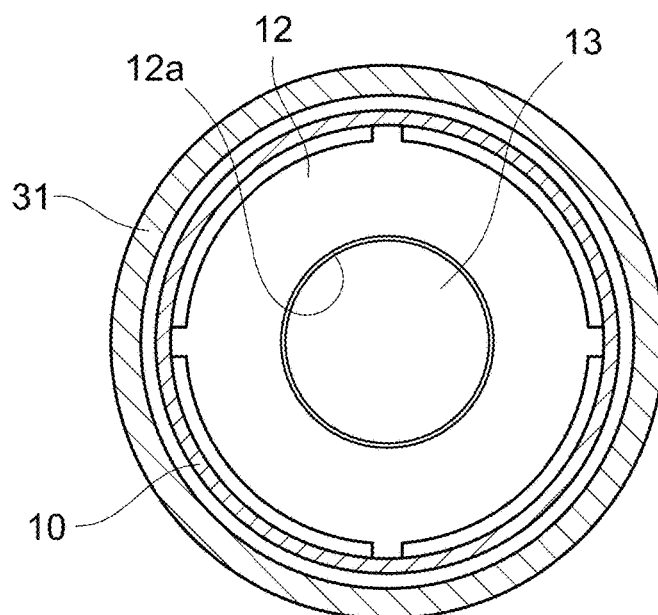
FIG. 11 is a view seeing a cross-section along a line A-A from vertically below.

FIG. 11 is a view seeing a cross-section along a line A-A of FIG. 9 from vertically below. As shown in FIG. 11, the ring plate 12 is a ring-shaped member. As aforementioned, in a case where the distance D2 is equal to or greater than the distance D1, an entirety of an exposed surface of the wafer 13 is encompassed by a range of the hole 12b of the ring plate 12.

An upper end of a rotary shaft 14 is connected to an actuator 15. Due to this, the wafer holder 11 is capable of being moved along the center axis A1, which is vertical to the wafer holding surface 11a, in an upward direction (direction toward an upper surface 11d side of the wafer holder 11) and in a downward direction (direction toward the wafer holding surface 11a of the wafer holder 11). Further, the wafer holder 11 can be rotated by the actuator 15.

The shower head 50 is arranged at a position facing the wafer holding surface 11a of the wafer holder 11. Regions on a surface of the shower head 50 where first nozzles 51 and second nozzles 52 are not provided are covered with a particular metal 53. In the present embodiment, a material containing tungsten is used as the particular metal.

<Vapor Phase Epitaxy Method>

A method of executing vapor phase epitaxy of a GaN layer on the wafer 13 by the HVPE method will be described. A vapor phase epitaxial condition is same as the condition aforementioned in connection to the first embodiment.

Figure 12:
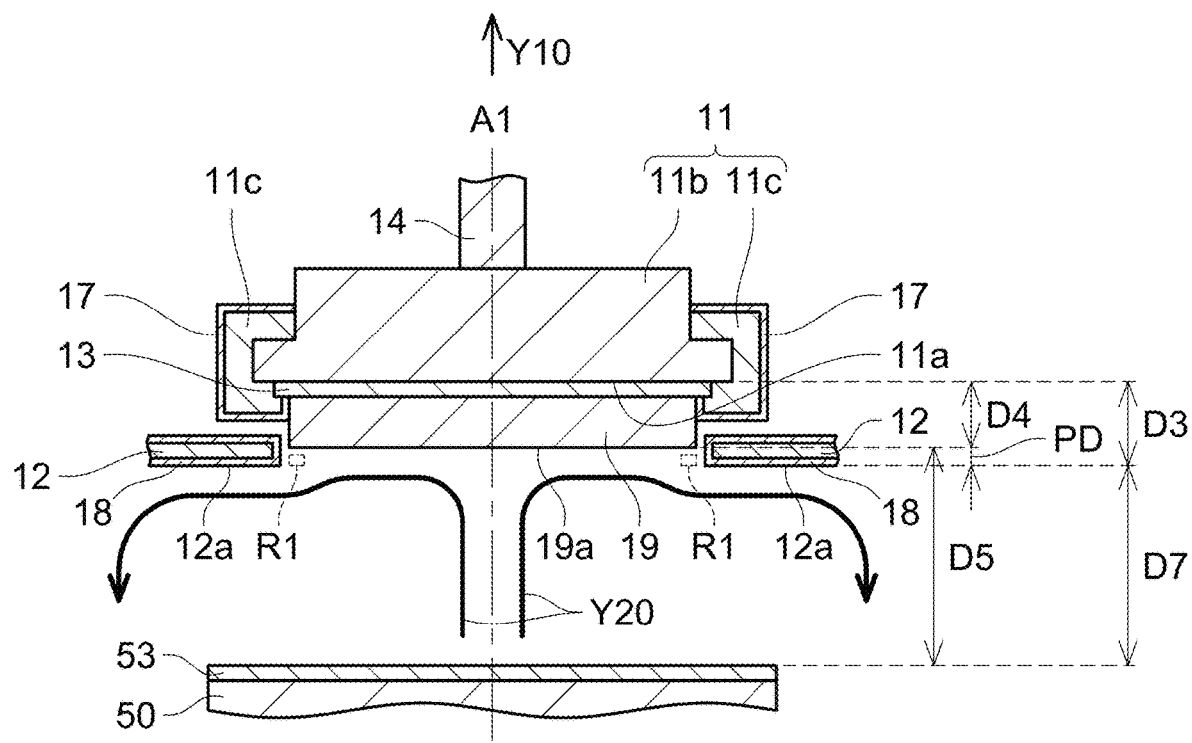
FIG. 12 is a partially enlarged view of the cross-section of the wafer holder, the ring plate, and the shower head.

A first heater 31 and a second heater 32 are turned on, and supplies of a first material gas G1 and a second material gas G2 are started. Due to this, vapor phase epitaxy of a GaN crystal layer on the wafer 13 can be executed. A growing speed of the GaN crystal layer is about 50 to 1000 μm/hour. When the GaN crystal layer 19 grows from a state in FIG. 10 to a state in FIG. 12, the actuator 15 starts a control to move the wafer holder 11 upward (in a direction of an arrow Y10) along the center axis A1. A rising speed of the wafer holder 11 is same as the growing speed of the GaN crystal layer 19. The growing speed may be predicted by calculation or may be calculated based on actual measurement. The state in FIG. 12 is a state in which a distance D3 from the wafer holding surface 11a to the lower surface 12a of the ring plate 12 is greater than a distance D4 from the wafer holding surface 11a to a surface 19a of the GaN crystal layer 19 by a predetermined distance PD. In other words, the state in FIG. 12 is a state in which the lower surface 12a of the ring plate 12 protrudes toward a shower head 50 side by the predetermined distance PD with respect to the surface 19a of the GaN crystal layer 19. The predetermined distance PD may be set to an arbitrary value based on experiment and the like.

Figure 13:
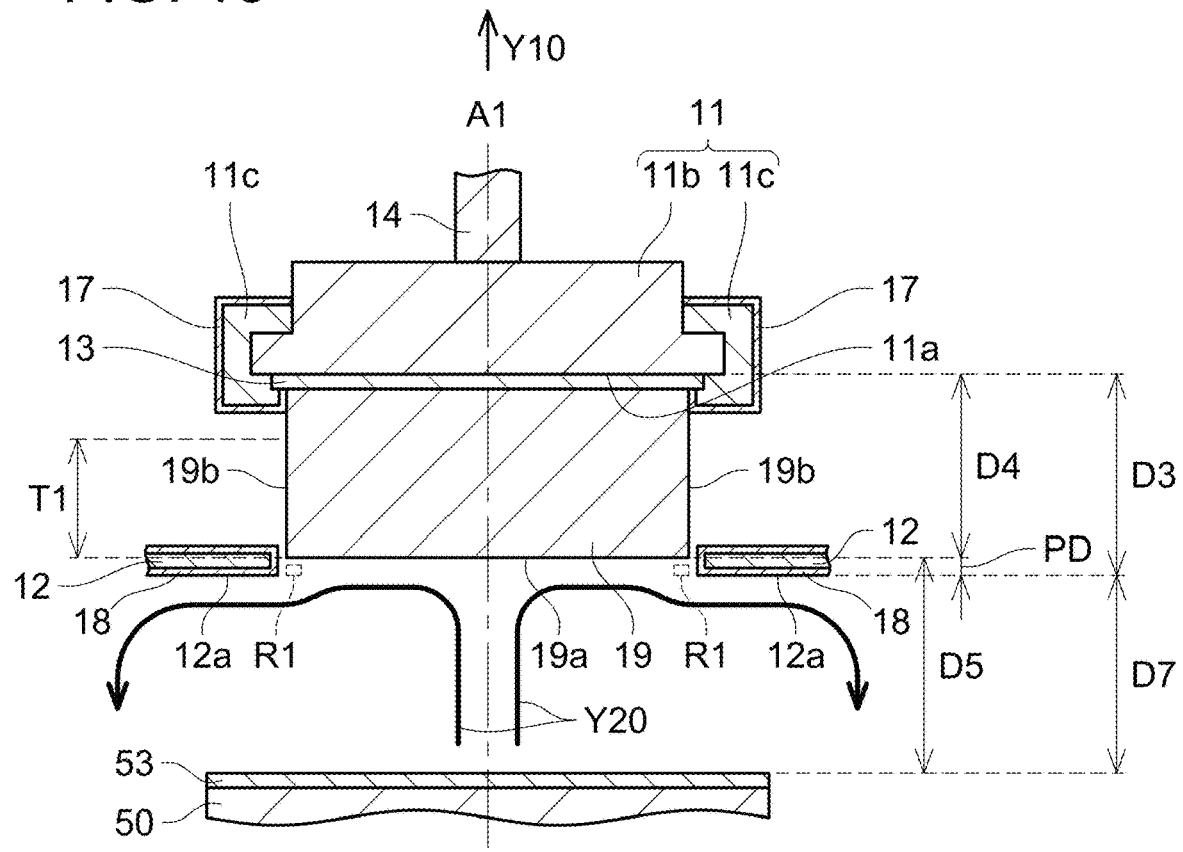
FIG. 13 is a partially enlarged view of the cross-section of the wafer holder, the ring plate, and the shower head.

A depiction of a state of having further grown the GaN crystal layer 19 from the state in FIG. 12 by a thickness T1 is shown in FIG. 13. Since the rising speed of the wafer holder 11 is equal to the growing speed of the GaN crystal layer 19, the wafer holder 11 has risen by a distance equal to the thickness T1. As a result, a state in which the distance D3 is greater than the distance D4 by the predetermined distance PD is maintained. Further, a distance D5 between the surface 19a of the GaN crystal layer 19 and the surface of the shower head 50 (gas supply outlet) is maintained constant in FIGS. 12 and 13.

<Effect>

Figure 14:
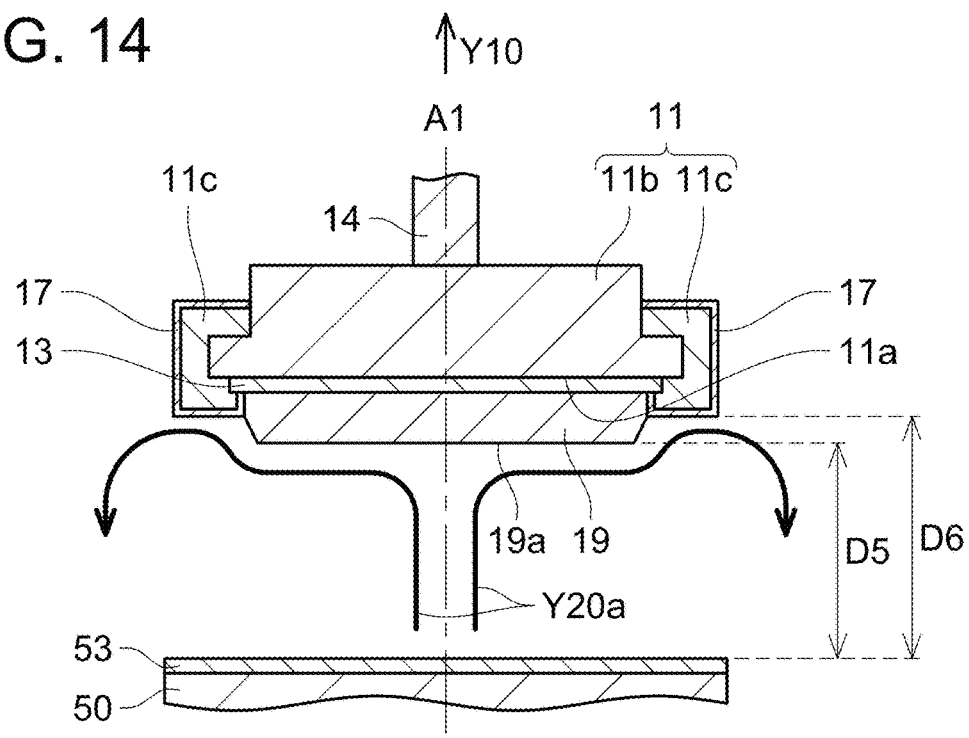
FIG. 14 is a partially enlarged view of a cross-section of a wafer holder, a ring plate, and a shower head of a comparative example.
Figure 15:
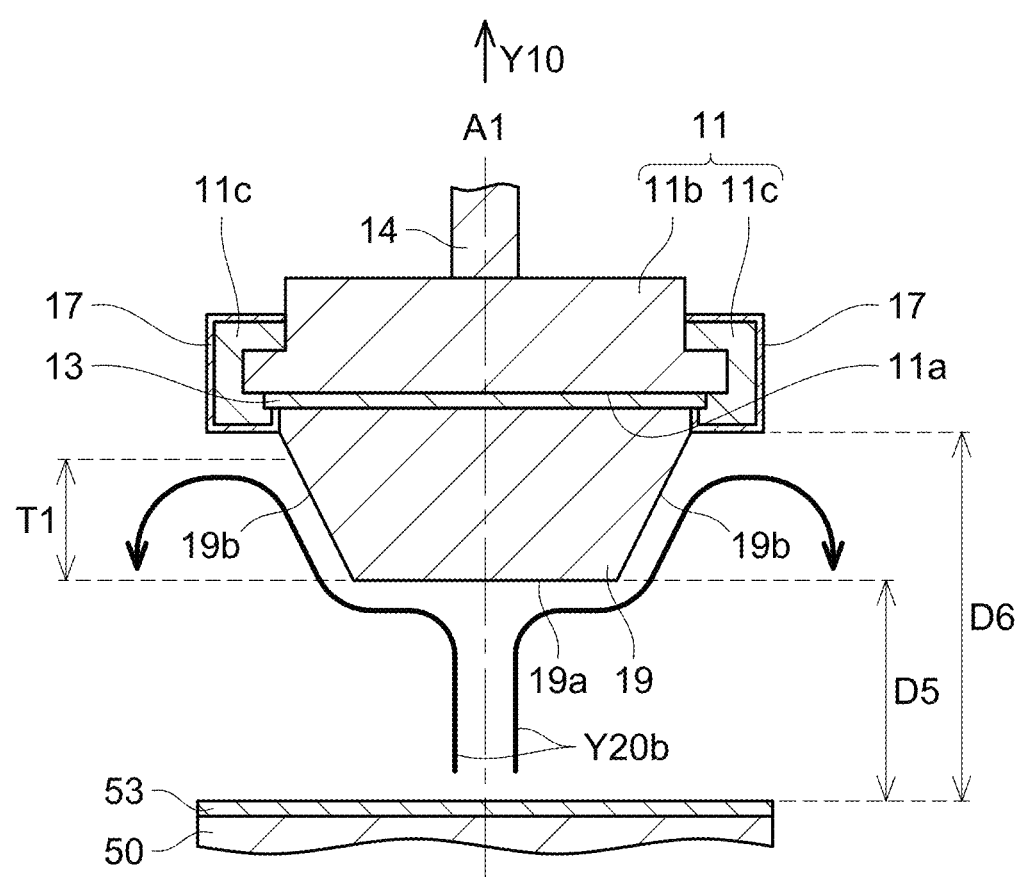
FIG. 15 is a partially enlarged view of the cross-section of the wafer holder, the ring plate, and the shower head of the comparative example.

Firstly, a comparative example will be described with reference to FIGS. 14 and 15. The comparative example is an example of a case in which the ring plate 12 of the present embodiment is not provided. A case will be described in which, in a course of a GaN crystal layer 19 growing and increasing its thickness from a state in FIG. 14 to a state in FIG. 15, a wafer holder 11 is moved upward (in a direction of an arrow Y10) along a center axis A1 according to increase in the thickness. In this case, a distance D5 between a surface 19a of the GaN crystal layer 19 and a surface of a shower head 50 (gas supply outlet) is maintained constant. However, a distance D6 between a lower surface 11cs of a supporting portion 11c arranged at an outer periphery of the GaN crystal layer 19 and the surface of the shower head 50 is not maintained constant, and is increased as the wafer holder 11 rises. As a result, flows of first and second material gases at a wafer outer peripheral portion cannot be maintained constant. That is, gas flows Y20a shown in FIG. 14 and gas flows Y20b shown in FIG. 15 become different. When this happens, passages of gas flows become unstable and raw material supplies to the surface 19a of the GaN crystal layer 19 as well as a temperature distribution changes from an initial stage of growth, by which crystal quality and distribution might be deteriorated. Further, an end surface 19b at the outer peripheral portion of the GaN crystal layer 19 that had grown to increase its thickness in a state where a crystal end face is open does not become vertical to a surface of a wafer 13 (c-plane), and instead becomes a tapered surface (see FIG. 15). This is because a tapered surface is a more stable plane than a vertical surface. Such a tapered surface is a plane ({10-11} plane) that is more stable than a m-plane, or a plane ({11-21} plane, {11-22} plane) that is more stable than an a-plane. Further, when such a tapered surface incorporates oxygen therein, a grating constant thereof becomes small and stress is generated, by which a crack may occur in the grown GaN crystal layer 19.

To the contrary, the vapor phase epitaxial growth device 1b of the present embodiment is provided with the ring plate 12, as shown in FIGS. 12 and 13. A position of the ring plate 12 is fixed relative to the shower head 50. As such, even in the case of moving the wafer holder 11 upward in accordance with the increase in the thickness of the GaN crystal layer 19, a distance D7 between the lower surface 12a of the ring plate 12 and the surface of the shower head 50 can be set constant. As a result, the present inventors have found, as a first effect of the ring plate 12, that a crystal that is uniform in a thickness direction can be obtained even in a case of growing the GaN crystal layer 19 by a long-term growth (that is, thick growth). This is considered as being due to the fact that flows of the first and second material gases at the wafer outer peripheral portion can be maintained constant by the ring plate 12 even in the case of rising the wafer holder 11. That is, it is considered as being due to the fact that gas flows Y20 shown in FIGS. 12 and 13 can be maintained same while growing the GaN crystal layer 19.

Further, the present inventors have found, as a second effect of the ring plate 12, that the end surface 19b of the outer peripheral portion of the GaN crystal layer 19 can be formed vertical with respect to the surface of the wafer 13. This is considered to be due to the fact that the state in which the lower surface 12a of the ring plate 12 protrudes to the shower head 50 side by the predetermined distance PD with respect to the surface 19a of the GaN crystal layer 19 can be achieved (see FIGS. 12 and 13). This will be described specifically. By causing the lower surface 12a of the ring plate 12 to protrude, stagnation of the gas flows can be created in a region R1 in a vicinity of a boundary between the ring plate 12 and the GaN crystal layer 19. A part of the stagnated gases is considered to be contributing to formation of a vertical crystal plane (such as a m-plane ({1-100} plane) and an a-plane ({11-20} plane)) along a wall surface. Due to this, a situation in which oxygen atoms are incorporated into the end surface 19b of the grown GaN crystal layer and a crack is generated in the GaN crystal layer 19 can be suppressed. Further, when a plurality of wafers is to be cut out from the GaN crystal layer 19, wafers with constant areas can be cut out.

Seventh Embodiment

Figure 16:
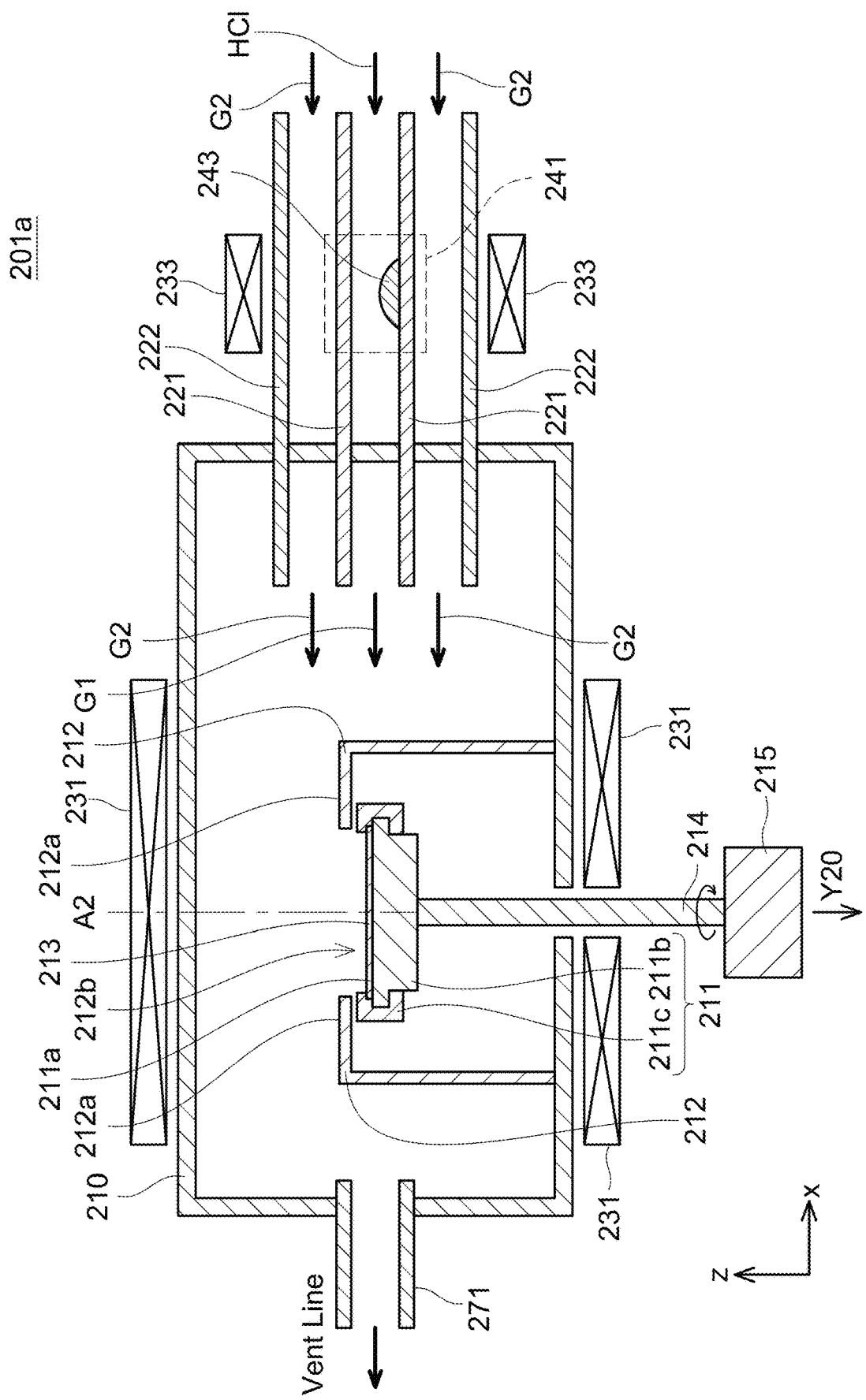
FIG. 16 is a schematic cross-sectional view seeing a vapor phase epitaxial growth device according to a seventh embodiment along the lateral direction.

FIG. 16 is a schematic cross-sectional view seeing a vapor phase epitaxial growth device 201a according to a seventh embodiment along the lateral direction. The vapor phase epitaxial growth device 201a of the seventh embodiment has a configuration in which supplying directions of a first material gas G1 and a second material gas G2 are changed from upward to lateral and an orientation of a wafer surface is changed from downward to upward as compared to the vapor phase epitaxial growth device 1b of the sixth embodiment. A basic configuration of the vapor phase epitaxial growth device 201a of the seventh embodiment is same as that of the vapor phase epitaxial growth device 1b of the sixth embodiment, thus a detailed description thereof will be omitted. Further, in the vapor phase epitaxial growth device 201a of the seventh embodiment (FIG. 16), constituent features that are same as those of the vapor phase epitaxial growth device 201 of the third embodiment (FIG. 6) are given same reference signs, and detailed description thereof will be omitted.

The vapor phase epitaxial growth device 201a is provided with a wafer holder 211 and a ring plate 212. The wafer holder 211 is provided with a holder body 211b and a supporting portion 211c. A wafer holding surface 211a is provided on an upper surface of the wafer holder 211. A wafer 213 is held on the wafer holding surface 211a.

The ring plate 212 is arranged above the wafer holder 211. An upper surface 212a of the ring plate 212 is a surface corresponding to the wafer holding surface 211a. In the present embodiment, the upper surface 212a is a plane parallel to the wafer holding surface 211a. The ring plate 212 is provided with a hole 212b corresponding to the wafer 213.

An actuator 215 is connected to a lower portion of the wafer holder 211 via a rotary shaft 214. The wafer holder 211 can be moved in up and down directions (a z direction in FIG. 16) along a center axis A2 vertical to the wafer holding surface 211a.

<Effect>

The vapor phase epitaxial growth device 201a of the seventh embodiment is provided with the ring plate 212. The ring plate 212 is fixed inside the reactor vessel 210. As such, by setting a lowering speed of the wafer holder 211 and a growing speed of a GaN crystal layer that grows on the wafer 213 to be same, a distance between the upper surface 212a of the ring plate 212 and a surface of the GaN crystal layer can be maintained constant. As a result, even in a case of lowering the wafer holder 211, flows of the first and second material gases at a wafer outer peripheral portion can be maintained constant. A GaN crystal layer 19 that is uniform in a thickness direction can be grown. Further, stagnation of the gas flows can be created in a region at the outer peripheral portion of the surface of the GaN crystal layer. Due to this, an end surface at the outer peripheral portion of the grown GaN crystal layer can be formed vertical to the surface of the wafer 213. As such, a situation in which a crack is generated in the grown GaN crystal layer can be suppressed.

Eighth Embodiment

Figure 17:
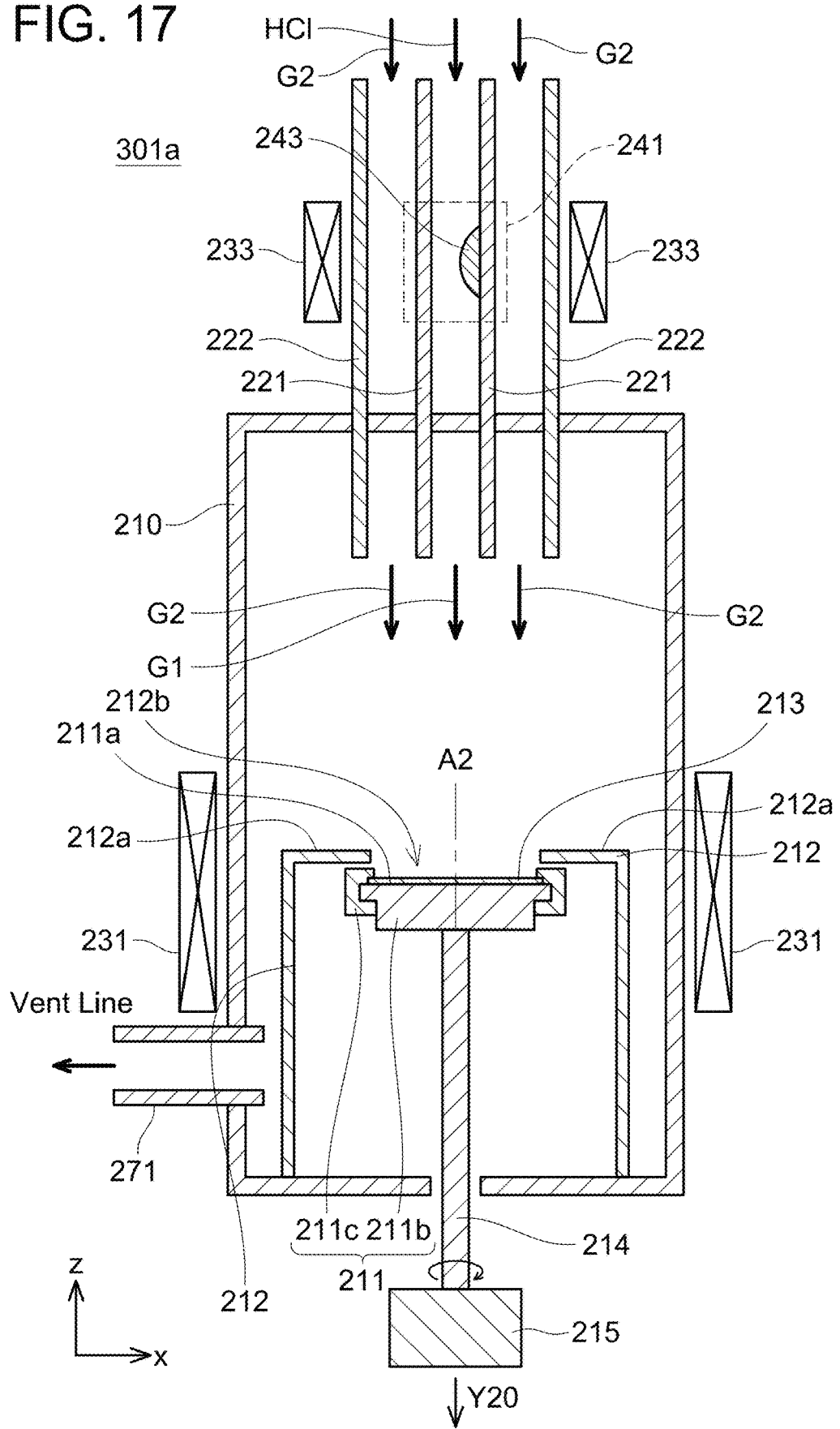
FIG. 17 is a schematic cross-sectional view seeing a vapor phase epitaxial growth device according to an eighth embodiment along the lateral direction.

FIG. 17 is a schematic cross-sectional view seeing a vapor phase epitaxial growth device 301a according to an eighth embodiment along the lateral direction. The vapor phase epitaxial growth device 301a of the eighth embodiment has a configuration in which positions of a first material gas supply pipe 221 and a second material gas supply pipe 222 moved from right side of a wafer to above the wafer as compared to the vapor phase epitaxial growth device 201a of the seventh embodiment. Further, it has a configuration in which a position of a gas exhaust pipe 271 is changed from left side of the wafer to below the wafer. Constituent features that are same as those of the vapor phase epitaxial growth device 201a of the seventh embodiment are given same reference signs, and detailed description thereof will be omitted.

In the vapor phase epitaxial growth device 301a of the eight embodiment as well, a lowering speed of a wafer holder 211 and a growing speed of a GaN crystal layer that grows on a wafer 213 are set to be same, by which a distance between an upper surface 212a of a ring plate 212 and a surface of the GaN crystal layer can be maintained constant. Since flows of first and second material gases at a wafer outer peripheral portion can be maintained constant, the GaN crystal layer that is uniform in a thickness direction can be grown. Further, stagnation of the gas flows can be created in a region at the outer peripheral portion of the surface of the GaN crystal layer, by which an end surface at the outer peripheral portion of the grown GaN crystal layer can be formed vertical to a surface of the wafer 213.

Modifications

Embodiments of the present invention have been described in detail with reference to the drawings, however, these are mere exemplary indications and thus do not limit the scope of the claims. The art recited in the claims includes modifications and variations of the specific examples presented above.

A region where heater(s) are arranged is not limited to a configuration in which it is divided into two, namely the regions H1 and H2, and may be divided into three or more. Due to this, temperatures of the wafer 13, the shower head 50, the first material gas generation unit 41, and the like can be controlled at a greater detail. For example, a temperature of a portion where the GaN polycrystal should not be deposited may be set higher than the temperature of the surface of the wafer 13. Specifically, a heater arranged around the wafer 13 and a heater arranged around the shower head 50 may be configured of separate heaters. By setting the temperature of the surface 50a of the shower head 50 higher than the temperature of the surface of the wafer 13 by about 50° C., deposition of the GaN polycrystal onto the surface 50a can be suppressed.

The temperature sufficient for the GaN crystal growth has been explained as 1050±50° C. Further, the temperature necessary for the generation of GaCl has been explained as 750° C. or higher. However, these temperatures are mere examples. For example, the temperature sufficient for the GaN crystal growth may be in a range of 1050±100° C.

A shape of the gas exhaust pipe 23 is not limited to shapes in the above embodiments, and may have a variation. For example, it may have a shape in which a plurality of narrow pipes is arranged on the outer periphery of the shower head 50.

The particular gas G3 discharged from the shower head 50 may contain HCl. Due to this, the GaN polycrystal having deposited on the surface of the shower head 50 and the nozzles thereof can be decomposed.

Numbers and arrangements of the first material gas supply pipes 21, the second material gas supply pipes 22, and the HCl gas supply pipes 25 shown in FIG. 1 are mere examples, and no limitation is made to this configuration.

A pump that is not shown may be provided on the vent line. A pressure in the gas exhaust pipe 23 may be set to a negative pressure with respect to a pressure in the vicinity of the surface of the wafer 13. Due to this, the gas discharge to sideways from the shower head 50 and downward from the wafer 13 as shown by the arrows Y2 in FIG. 1 can be performed smoothly.

The art disclosed herein is not limited to the HVPE method, and may be adapted to various epitaxial methods. For example, it may be adapted to a MOVPE (Metal Organic Vapor Phase Epitaxy) method. In this case, trimethylgallium (Ga(CH$_3$)$_3$) may be used as the first material gas G1.

The art disclosed herein is not limited to GaN, and may be adapted to crystal growth of various other compound semiconductors. For example, it may be adapted to growth of GaAs crystal. In this case, arsine (AsH$_5$) may be used as the second material gas G2.

The first material gas G1 and the second material gas G2 may each be flown with a carrier gas such as H$_2$ and N$_2$.

Tungsten has been explained as the example of the metal capable of decomposing NH$_3$ by the catalytic effect, however, no limitation is made to this material. Tungsten oxides (WOx), tungsten carbides (WCx), and tungsten nitrides (WNx) may be used as well. Further, metals containing tungsten (tungsten alloys) and oxides, carbides, and nitrides thereof may be used as well. Further, other metals such as ruthenium, iridium, platinum, molybdenum, palladium, rhodium, iron, nickel, and rhenium may be used as well. Further, oxides, carbides, and nitrides of such metals and alloys containing such metals may be used as well.

The structure of the shower head is not limited to the structure shown in the second embodiment. For example, it may have a configuration in which a mixed gas in which the first material gas G1 and the second material gas G2 are mixed is discharged from the shower head. FIG. 18 is a schematic cross-sectional view seeing a shower head 50 provided with a mixing chamber 57 for generating the mixed gas along the lateral direction. First nozzles 51 and second nozzles 52 of the shower head 50 are connected to a lower portion of the mixing chamber 57. A plurality of gas supply outlets 58 is arranged at an upper portion of the mixing chamber 57. Inner and outer walls of the mixing chamber 57 are covered with a particular metal 56. The first material gas G1 and the second material gas G2 are mixed inside the mixing chamber 57 and the mixed gas Gm is discharged from the gas supply outlets 58. An effect thereof will be described. Since the mixed gas Gm can be discharged from the gas supply outlets 58 of the mixing chamber 57, a V/III ratio of a material gas supplied to a wafer can be uniformized. A uniform GaN crystal can be grown. Further, since it becomes possible to increase the V/III ratio, a growing rate of the GaN crystal can be increased. Further, in a case of not having the mixing chamber 57, it has been necessary to ensure a certain degree of distance between gas supply outlets and a wafer surface to sufficiently mix the first material gas G1 and the second material gas G2. However, in the structure of FIG. 18 provided with the mixing chamber 57, the gas supply outlets and the wafer surface can be set closer, by which the growing rate of the GaN crystal can be increased and gas consumption amounts can be suppressed by increasing raw material efficiency. Further, a first heater 31 (see FIG. 1) is arranged around the mixing chamber 57. Due to this, the particular metal 56 can be maintained to 800° C. or higher over an entirety of the mixing chamber 57. Deposition of GaN polycrystal on the inner and outer walls of the mixing chamber 57 can be suppressed.

In the second embodiment, the surface of the shower head 50 is covered with the particular metal 53, however, no limitation is made to this configuration, and a lateral side surface of the shower head 50 may be covered with the particular metal 53. In the third to fifth embodiments, configurations in which the inner and outer walls of the gas supply pipes in the vicinities of the ends thereof have been described, however, no limitation is made to these configurations. The gas supply pipes may be constituted of a material containing a particular metal.

In the second to fifth embodiments, configurations in which the gas supply outlets of both the first material gas supply pipe and the second material gas supply pipe are covered with the particular metal have been described, however, no limitation is made to these configurations. The surface of at least one of the gas supply pipes in a region in the vicinity of its gas supply outlet may be covered with the particular metal. For example, in structures as in the third embodiment (FIG. 6) and the fourth embodiment (FIG. 7) in which the first material gas supply pipe 221 is arranged inside the second material gas supply pipe 222, the GaN polycrystal tends to deposit in the region in the vicinity of the supply outlet of the first material gas supply pipe 221. As such, only the inner and outer walls of the first material gas supply pipe 221 at its supply outlet may be covered with the particular metal 253. To the contrary, only the inner and outer walls of the second material gas supply pipe 222 at its supply outlet may be covered with the particular metal 253.

In the second embodiment, a configuration in which the regions R1 to R3 are surrounded by the first heater 31 has been described, however, the first heater 31 may be divided into two or more. Due to this, temperatures of the regions R1 to R3 can separately be controlled.

Cases in which the first material gas G1 is a gas containing GaCl has been described, however, no limitation is made to this configuration. The first material gas G1 may be any gas having whatever chemical composition so long as it is a gas containing Ga. For example, the first material gas G1 may be a gas containing gallium trichloride ($GaCl_3$). In this case, a growing temperature of about 1300° C. may be used. GaN crystal growth may be performed on a N-plane (−c plane). Due to this, a GaN crystal surface can be enlarged as growth thereof progresses.

The numbers and arrangements of the first material gas supply pipes and the second material gas supply pipes described herein are mere examples, and no limitation is made to these configurations.

The lower surface 12a of the ring plate 12 described in FIG. 10 is not limited to a flat surface. It may be a curved surface, and a part thereof may be a flat surface. Further, in a case where the lower surface 12a includes a flat surface portion, the flat surface portion may have an angle with respect to the wafer holding surface 11a. The same applies to the upper surface 212a of the ring plate 212 in FIGS. 16 and 17.

A shape of the wafer 13 is not limited to circle. Substrates in shapes of square, hexagon, and the like may be used.

The ring plates 12 and 212 are not limited to being circular, and may be in shapes such as polygons and rectangles. Further, the ring plates 12 and 212 each do not need to have a shape that is completely closed, so long as they have a substantially ring shape. For example, they may each be C-shaped.

In FIG. 10, the case in which the distance D2 is equal to or greater than the distance D1 has been described, however, no limitation is made to this configuration. For example, the distance D2 may be smaller than the distance D1. Due to this, even in a case where a crystal diameter shrinks in an initial period until when the surface of the GaN crystal layer 19 reaches the upper surface of the ring plate 12 (that is, a period before the ring plate 12 starts to function), an inner diameter of the hole 12b of the ring plate 12 can be adapted to correspond to a shrunk crystal diameter.

Cases in which a surface of the base substrate is the +c-plane have been described, however, no limitation is made to these configurations. Various planes may be used as the surface of the base substrate.

Cases in which the m-plane ({1-100} plane) and the a-plane ({11-20} plane) are used as examples of forming the end surfaces vertical to the crystal surfaces have been described, however, no limitation is made to this configuration. Various crystal planes and intermediate surface configurations may be used.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The center hole 54 is an example of a first center hole. The surrounding hole 55 is an example of a first surrounding hole. The particular gas supply pipe 16 is an example of a particular gas supply unit. The first heater 31, the heater 232, and the heater 432 are examples of a first heating unit. The first heater 31 is an example of a third heating unit. The first valve 61 is an example of a first supply unit. The second valve 62 is an example of a second supply unit. The ring plate 12 is an example of a ring unit. The lower surface is an example of a first surface. The upper surface is an example of a second surface.

The invention claimed is:

1. A vapor phase epitaxial growth device of a compound semiconductor, the device comprising:
   a reactor vessel;
   a wafer holder arranged within the reactor vessel and including a wafer holding surface configured to hold a wafer with a wafer surface oriented substantially vertically downward;
   a first material gas supply pipe configured to supply a first material gas into the reactor vessel and arranged below the wafer holding surface;
   a second material gas supply pipe configured to supply a second material gas, which reacts with the first material gas, into the reactor vessel and arranged below the wafer holding surface;
   a shower head to which outlets of the first material gas supply pipe and the second material gas supply pipe are connected,
   a surface of the shower head being arranged at a position below the wafer holding surface and facing the wafer holding surface;
   a particular gas supply unit configured to supply a first particular gas into the reactor vessel substantially vertically downward from above the wafer holder, the first particular gas being a gas not containing oxygen and being a gas that does not react with the first material gas nor with the second material gas;
   a gas exhaust pipe configured to exhaust gases in the reactor vessel and arranged below the wafer holding surface,
   wherein
   the first material gas supply pipe, the second material gas supply pipe, and the gas exhaust pipe are arranged to extend along a substantially vertical direction,
   a distance between the gas exhaust pipe and an axis line passing through a center of the wafer holding surface and vertical to the wafer holding surface is greater than distances between the axis line and each of the first material gas supply pipe and the second material gas supply pipe,
   an inlet of the gas exhaust pipe is located on a lateral side surface of the shower head,
   the first material gas and the second material gas discharged from the shower head flow within the reactor vessel vertically upward,
   the first material gas and the second material gas that were used for crystal growth of the compound semiconductor on the surface of the wafer are exhausted in a lateral side surface direction of the shower head and a downward direction from the wafer, and
   the first particular gas flows vertically downward from above the wafer holder and is suctioned into the inlet of the gas exhaust pipe.

2. The vapor phase epitaxial growth device according to claim 1, further comprising a heater arranged around the wafer holder, the first material gas supply pipe, the second material gas supply pipe, and the gas exhaust pipe.

3. The vapor phase epitaxial growth device according to claim 1, wherein
a plurality of first nozzles is configured to supply the first material gas into the reactor vessel and a plurality of second nozzles is configured to supply the second material gas into the reactor vessel are arranged on the surface of the shower head.

4. The vapor phase epitaxial growth device according to claim 3, wherein
each of the plurality of first nozzles includes:
a first center hole configured to discharge the first material gas; and
a first surrounding hole arranged around the first center hole and configured to discharge a second particular gas,
each of the plurality of second nozzles includes:
a second center hole configured to discharge the second material gas; and
a second surrounding hole arranged around the second center hole and configured to discharge the second particular gas, and
the second particular gas is a gas not containing oxygen and is a gas that does not react with the first material gas nor with the second material gas.

5. The vapor phase epitaxial growth device according to claim 1, wherein the surface of the shower head has a material not containing silicon nor oxygen arranged thereon.

6. The vapor phase epitaxial growth device according to claim 1, wherein the surface of the shower head has a material containing tungsten arranged thereon.

7. The vapor phase epitaxial growth device according to claim 1, further comprising:
a heater,
wherein
a surface of at least one of the first material gas supply pipe and the second material gas supply pipe in a region in a vicinity of a gas supply outlet is covered with a catalyst,
the catalyst is capable of decomposing the second material gas by a catalytic effect, and
the heater is configured to heat a surface of the catalyst to 800° C. or higher and 1100° C. or lower.

8. The vapor phase epitaxial growth device according to claim 7, further comprising:
a shower head having a plurality of gas supply outlets of the first material gas supply pipe and a plurality of gas supply outlets of the second material gas supply pipe arranged thereon,
wherein the surface of the shower head at least on a gas supply outlet side is covered with the catalyst.

9. The vapor phase epitaxial growth device according to claim 7, wherein
the gas supply outlet is arranged at ends of the first material gas supply pipe and the second material gas supply pipe,
an inner wall and an outer wall of the first material gas supply pipe in a region in a vicinity of the end of the first material gas supply pipe on a gas supply outlet side are covered with the catalyst, and
an inner wall and an outer wall of the second material gas supply pipe in a region in a vicinity of the end of the second material gas supply pipe on the gas supply outlet side are covered with the catalyst.

10. The vapor phase epitaxial growth device according to claim 7, wherein the catalyst is a material containing tungsten.

11. The vapor phase epitaxial growth device according to claim 1, further comprising:
a ring unit including a hole corresponding to the wafer held by the wafer holding surface; and
an actuator configured to move at least one of the wafer holder and the ring unit along the axis line vertical to the wafer holding surface and configured to maintain a constant distance between a surface of the ring unit and a surface of a compound semiconductor crystal grown on the wafer.

12. The vapor phase epitaxial growth device according to claim 11, wherein the surface of the ring unit is covered with a catalyst capable of decomposing the second material gas by a catalytic effect.

13. The vapor phase epitaxial growth device according to claim 12, wherein the catalyst is a material containing tungsten.

14. The vapor phase epitaxial growth device according to claim 11, wherein
the first material gas is a gas containing GaCl, and
the second material gas is a gas containing $NH_3$.

* * * * *